United States Patent
Namiki et al.

(10) Patent No.: US 8,194,465 B2
(45) Date of Patent: Jun. 5, 2012

(54) NON-VOLATILE SEMICONDUCTOR STORAGE DEVICE

(75) Inventors: Yuko Namiki, Yokohama (JP); Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 12/883,520

(22) Filed: Sep. 16, 2010

(65) Prior Publication Data

US 2011/0069557 A1    Mar. 24, 2011

(30) Foreign Application Priority Data

Sep. 17, 2009  (JP) ................................ 2009-215160
Sep. 10, 2010  (JP) ................................ 2010-203076

(51) Int. Cl.
*G11C 11/34* (2006.01)
(52) U.S. Cl. ................................. 365/185.22
(58) Field of Classification Search ............. 365/185.22
See application file for complete search history.

(56) References Cited

U.S. PATENT DOCUMENTS

| | | | |
|---|---|---|---|
| 5,673,223 A | 9/1997 | Park | |
| 7,009,881 B2 | 3/2006 | Noguchi | |
| 7,649,776 B2 | 1/2010 | Abiko et al. | |
| 7,965,555 B2 * | 6/2011 | Namiki et al. | 365/185.17 |
| 2009/0052242 A1 | 2/2009 | Takekida et al. | |
| 2009/0238003 A1 * | 9/2009 | Namiki et al. | 365/185.17 |
| 2009/0251971 A1 * | 10/2009 | Futatsuyama | 365/185.22 |
| 2010/0037007 A1 | 2/2010 | Futatsuyama et al. | |
| 2010/0067299 A1 | 3/2010 | Futatsuyama | |
| 2011/0157997 A1 * | 6/2011 | Kamigaichi et al. | 365/185.22 |
| 2011/0242892 A1 * | 10/2011 | Namiki et al. | 365/185.17 |

FOREIGN PATENT DOCUMENTS

JP    2009-48697    3/2009

OTHER PUBLICATIONS

U.S. Appl. No. 13/053,796, filed Mar. 22, 2011, Futatsuyama, et al.

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

A non-volatile semiconductor storage device according to one aspect has a memory cell array, a first wiring, a second wiring, and a control circuit. The control circuit is configured to, at the time of the write operation, control the write operation in each of the memory strings such that a memory cell positioned closer to the second wiring is subject to the write operation earlier, and the write operation sequentially proceeds to farther memory cells. On the other hand, the control circuit is also configured to, at the time of the read operation, apply a higher voltage to gates of unselected memory cells as a selected memory cell is located at a region closer to the first wiring.

22 Claims, 24 Drawing Sheets

Vread(0) < Vread(2) < Vread(k) < Vread(m-2) < Vread(m)

Vread(0) < Vread(2) < Vread(k) < Vread(m-2) < Vread(m)

Vread(0) < Vread(2) < Vread(k) < Vread(m−2) < Vread(m)

- $Vav(0) < Vav(2) < Vav(k) < Vav(m-2) < Vav(m)$
- $Vread(0) < Vread(2) < Vread(k) < Vread(m-2) < Vread(m)$ Vread(0)' > Vread(2)' > Vread(k)' > Vread(m-2)' > Vread(m)'

Vread(0)' > Vread(2)' > Vread(k)' > Vread(m−2)' > Vread(m)'

NON-VOLATILE SEMICONDUCTOR STORAGE DEVICE

CROSS-REFERENCE TO RELATED APPLICATIONS

This application is based upon and claims the benefit of priority from the prior Japanese Patent Application No. 2009-215160, filed on Sep. 17, 2009, and the prior Japanese Patent Application No. 2010-203076, filed on Sep. 10, 2010, the entire contents of which are incorporated herein by reference.

BACKGROUND

1. Field

Embodiments described herein relate generally to a non-volatile semiconductor storage device (EEPROM) including electrically rewritable non-volatile memory cells.

2. Description of the Related Art

With recent advances in miniaturization of NAND-type flash memory, reliability of data read becomes an issue.

NAND-type flash memory has memory cells connected in series, a source line connected to one end of each of the memory cells connected in series, and bit lines connected to the other end thereof.

When a data write operation is performed in the NAND-type flash memory, the voltage to be applied to memory cells will be changed in the following order. That is, a pass voltage Vpass (on the order of 8 V), which is as high as not to change a threshold voltage, is applied to the gates of unselected memory cells. As a result, the unselected memory cells are turned on. Then, a program voltage Vprg (20 V or more) is applied to the gate of a selected memory cell. As a result, electric charges are accumulated in the floating gate of the selected memory cell. Consequently, the threshold voltage of the selected memory cell increases ("0" data is written to the selected memory cell). This is a writing procedure.

In addition, a so-called sequential writing scheme is commonly employed for writing data to memory cells sequentially from the one closest to a source line.

DETAILED DESCRIPTION

A non-volatile semiconductor storage device according to one aspect comprises a memory cell array, a first wiring, a second wiring, and a control circuit. The memory cell array includes an array of memory strings, each of the memory strings including a plurality of memory cells connected in series. The first wiring is electrically connected to one end of each of the memory strings and charged to a first voltage at the time of a read operation. The second wiring is electrically connected to the other end of each of the memory strings and set at a second voltage lower than the first voltage at the time of a read operation. The control circuit is configured to control data write and read operations to and from the memory cells. The control circuit is also configured to, at the time of the write operation, control the write operation in each of the memory strings such that a memory cell positioned closer to the second wiring is subject to the write operation earlier, and the write operation sequentially proceeds to farther memory cells. On the other hand, the control circuit is also configured to, at the time of the read operation, apply a higher voltage to gates of unselected memory cells as a selected memory cell is located at a region closer to the first wiring.

A non-volatile semiconductor storage device according to another aspect comprises a memory cell array, a first wiring, a second wiring, and a control circuit. The memory cell array includes an array of memory strings, each of the memory strings including a plurality of memory cells connected in series. The first wiring is electrically connected to one end of each of the memory strings and charged to a first voltage at the time of a read operation. The second wiring is electrically connected to the other end of each of the memory strings and set at a second voltage lower than the first voltage at the time of a read operation. The control circuit is configured to control data write and read operations to and from the memory cells. The control circuit is also configured to, at the time of the write operation, control the write operation in each of the memory strings such that a memory cell positioned closer to the second wiring is subject to the write operation earlier, and the write operation sequentially proceeds to farther memory cells. On the other hand, the control circuit is also configured to, at the time of the read operation, apply a higher voltage to gates of unselected memory cells as a selected memory cell is located at a region closer to the second wiring.

Embodiments of the present invention will be described below with reference to the accompanying drawings.

[First Embodiment]

[Configuration of Non-Volatile Semiconductor Storage Device in First Embodiment]

Figure 1:
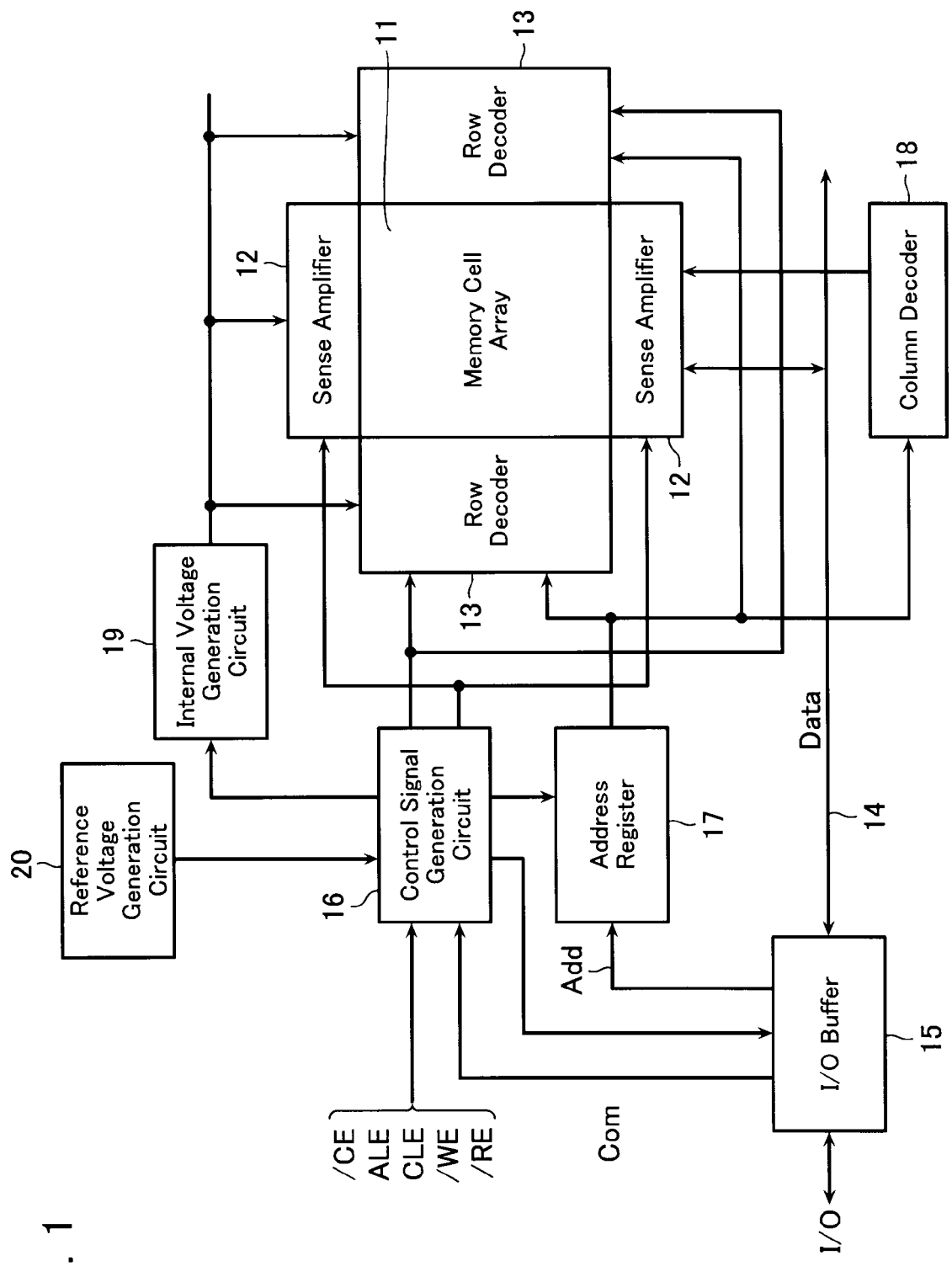
FIG. 1 is a block diagram illustrating a configuration of a non-volatile semiconductor storage device according to a first embodiment.
Figure 2:
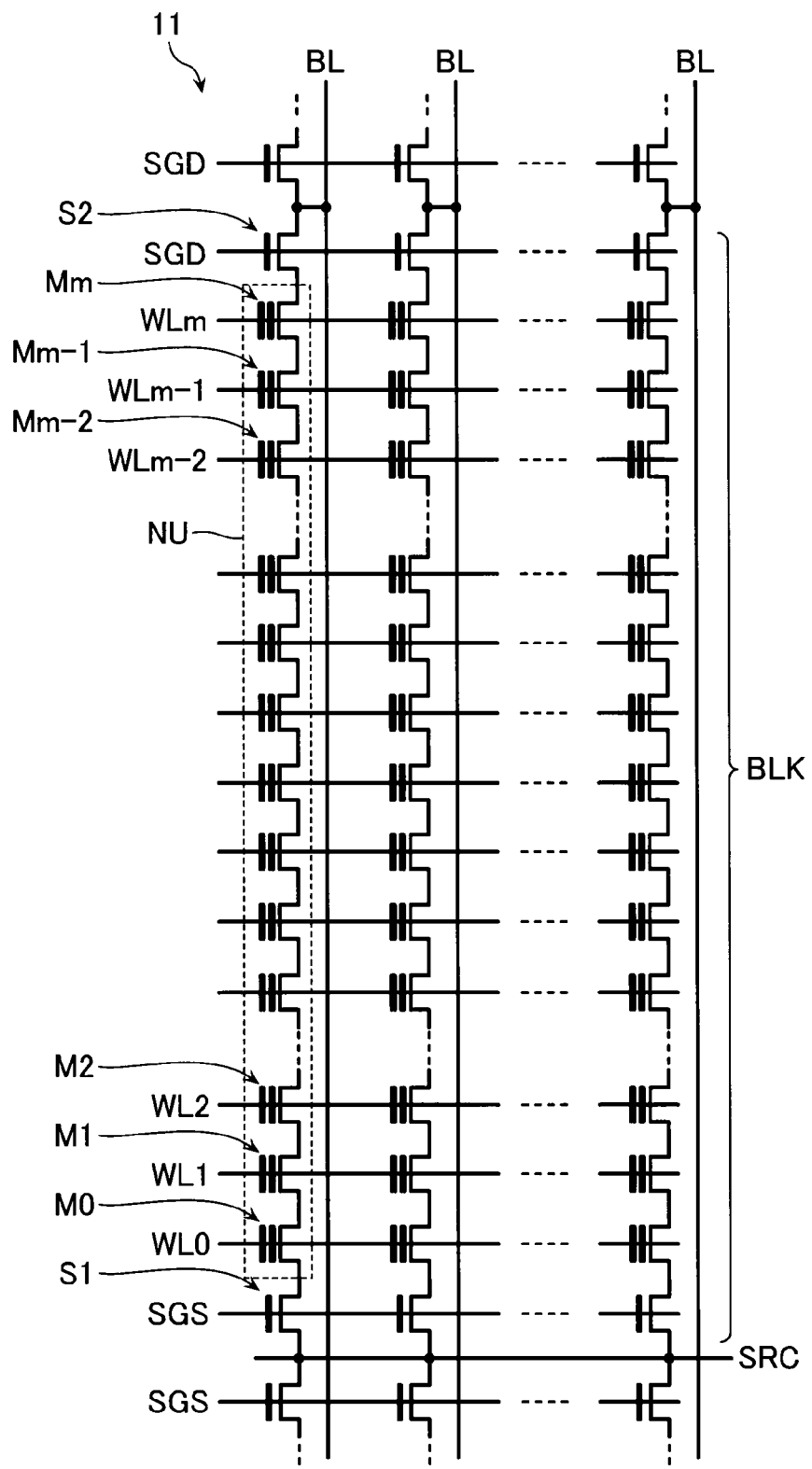
FIG. 2 is an equivalent circuit diagram illustrating a memory cell array 11 in the memory according to the first embodiment.

Referring first to FIGS. 1 and 2, a configuration of a non-volatile semiconductor storage device according to a first embodiment will be described below. FIG. 1 is a block diagram illustrating the configuration of the non-volatile semiconductor storage device according to the first embodiment (NAND-type flash memory). FIG. 2 is a circuit diagram illustrating a memory cell array 11, which will be discussed later.

As illustrated in FIG. 1, the non-volatile semiconductor storage device according to the first embodiment comprises a memory cell array 11, sense amplifiers 12, row decoders 13, a data line 14, an I/O buffer 15, a control signal generation circuit 16, an address register 17, a column decoder 18, an internal voltage generation circuit 19, and a reference voltage generation circuit 20.

As illustrated in FIG. 2, the memory cell array 11 includes NAND cell units NU arranged in a matrix form. Each NAND cell unit NU has m+1 electrically rewritable non-volatile memory cells M0-Mm connected in series, and select transistors S1 and S2. The select transistors each have one end connected to a bit line BL or a common source line SRC, respectively.

As illustrated in FIG. 2, the control gates of memory cells M0 to Mm in a NAND cell unit NU are connected to different word lines WL0-WLm. The gates of the select transistors S1 and S2 are connected to select gate lines SGS and SGD, respectively. A set of NAND cell units NU sharing one word line WL is included in one block BLK. A data erase operation is performed on a block-by-block basis. As illustrated in FIG. 2, a plurality of blocks BLK are arranged along the bit-line direction. Each bit line BL is connected to the sense amplifiers 12. Those memory cells commonly connected to one word line WL are included in one or more pages.

Referring again to FIG. 1, the components other than the memory cell array 11 of the non-volatile semiconductor storage device will be described below. As illustrated in FIG. 1, the sense amplifiers 12 are arranged in the bit-line direction of the memory cell array 11, and connected to the bit lines BL to perform data read operations on a page-by-page basis. The sense amplifiers 12 are also data latches for retaining data to be written to one page. That is, read and write operations are performed on a page-by-page basis. It is also assumed that the sense amplifiers 12 are of current detection type that allows data to be read from a plurality of selected memory cells through all of the bit lines BL in the block BLK. A data cache for temporarily retaining input data and a column selection gate circuit for selecting columns are attached to each sense amplifier 12.

As illustrated in FIG. 1, the row decoders 13 are arranged in the word-line direction of the memory cell array 11, and each selectively drive the word line WL, the select gate line SGD, and the select gate line SGS according to a row address. Each row decoder 13 includes a word line driver and a select gate line driver. In addition, the column decoder 18 is provided in association with the sense amplifiers 12 to control the column selection gate circuits in the sense amplifiers 12. The row decoders 13, the column decoder 18, and the sense amplifiers 12 together provide a read/write circuit to read data from and write data to the memory cell array 11.

Data transfer between an external input/output port I/O and the sense amplifiers 12 is performed by an input/output buffer 15 and the data line 14. That is, page data that is read by the sense amplifiers 12 is output on the data line 14, and then output via the input/output buffer 15 to the input/output port I/O. In addition, write data that is supplied from the input/output port I/O is loaded via the input/output buffer 15 into the sense amplifiers 12.

Address data Add that is supplied from the input/output port I/O is supplied through the address register 17 to the row decoders 13 and the column decoder 18. Command data Com that is supplied from the input/output port I/O is decoded and set on the control signal generation circuit 16.

An external control signal, including chip enable signal /CE, address latch enable signal ALE, command latch enable signal CLE, write enable signal /WE, and read enable signal /RE, is supplied to the control signal generation circuit 16. Based on the command Com and the external control signal, the control signal generation circuit 16 provides operational control of the entire operation of memory, and controls the internal voltage generation circuit 19 to generate various types of internal voltages required for data read, write, and erase operations. In addition, the control signal generation circuit 16 is applied with a reference voltage from the reference voltage generation circuit 20. The control signal generation circuit 16 performs write operations sequentially from a selected memory cell M closest to the source line SL, and controls read operations.

Figure 3:
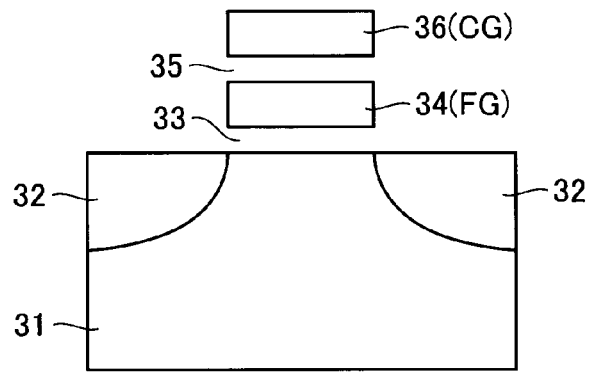
FIG. 3 is a cross-sectional view of a memory cell M.
Figure 4:
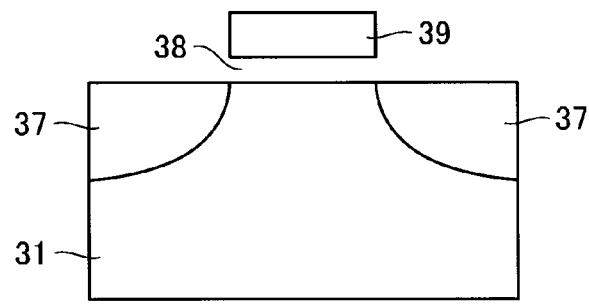
FIG. 4 is a cross-sectional view of each select transistor S1, S2.
Figure 5:
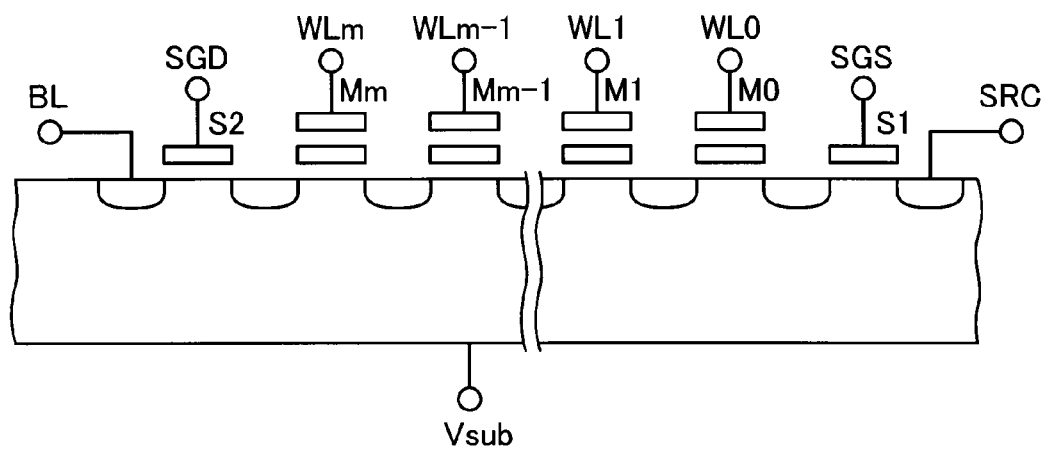
FIG. 5 is a cross-sectional view of a NAND cell unit NU.

Referring now to FIGS. 3 to 5, cross-sectional structures of a memory cell M and select transistors S1, S2 will be described below.

As illustrated in FIG. 3, a memory cell M has n-type diffusion layers 32 on a substrate 31 that function as the source and drain of a MOSFET. The memory cell M also has a floating gate (FG) 34 on the substrate 31 via a gate insulation film 33, and a control gate (CG) 36 on the floating gate 34 via an insulation film 35.

As illustrated in FIG. 4, the select transistors S1 and S2 each have the substrate 31 and n-type diffusion layers 37 formed on the substrate 31 as a source and a drain. In addition, the select transistors S1 and S2 each have a control gate 39 on the substrate 31 via a gate insulation film 38.

FIG. 5 illustrates a cross-section of one NAND cell unit NU in the memory cell array 11. One NAND cell unit NU includes m+1 memory cells M0 to Mm that are connected in series. Each memory cell has the configuration as illustrated in FIG. 3. The select transistors S1 and S2 having the configuration as illustrated in FIG. 4 are provided on the source side and the drain side of the NAND cell unit NU, respectively.

[Operation of Non-Volatile Semiconductor Storage Device in First Embodiment]

Figure 6:
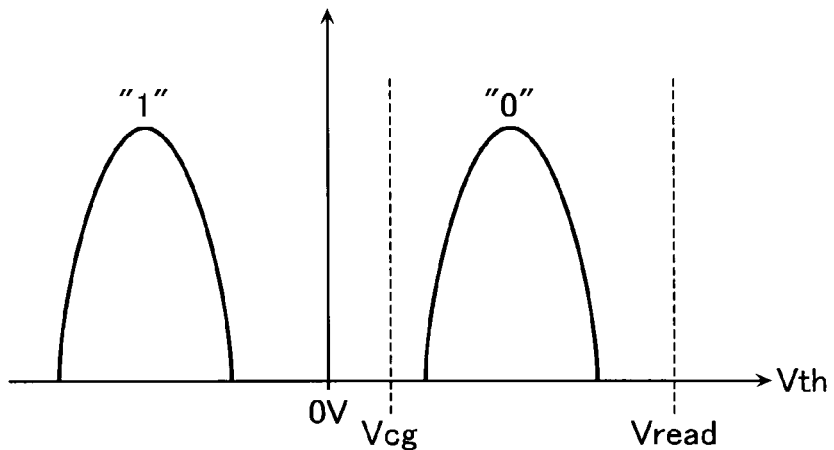
FIG. 6 illustrates a distribution of threshold voltages of a memory cell M.
Figure 7:
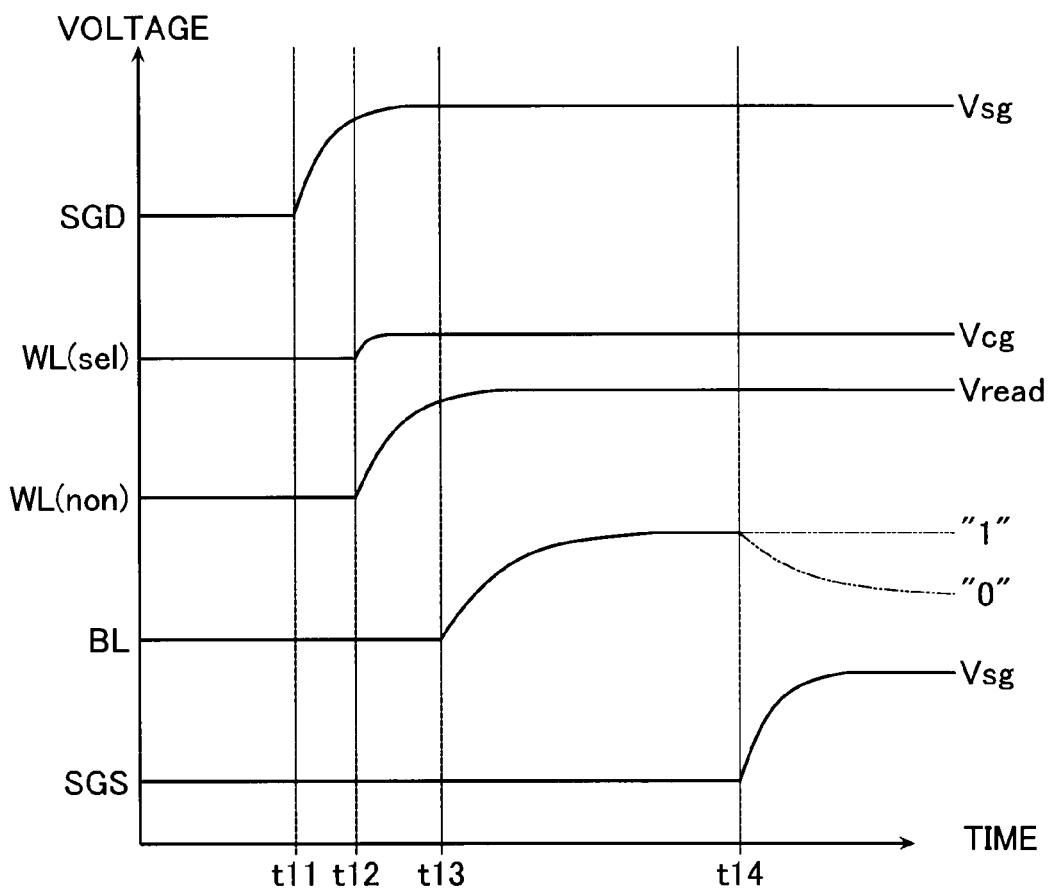
FIG. 7 is a timing chart illustrating a read operation of the non-volatile semiconductor storage device according to the first embodiment.

Referring now to FIGS. 6 and 7, an operation of the non-volatile semiconductor storage device according to the first embodiment will be described below. FIG. 6 illustrates a distribution of threshold voltages of a memory cell M according to the first embodiment. FIG. 7 is a timing chart at the time of a data read operation of the non-volatile semiconductor storage device according to the first embodiment.

Assuming that each memory cell M stores binary data in the first embodiment, a distribution of threshold voltages of data is as illustrated in FIG. 6. One state having a negative threshold voltage represents a first data state, i.e., "1" data (erased state), and one state having a positive threshold voltage represents a second data state, i.e., "0" data. Any cell written with "1" or "0" data will not turn on unless a voltage Vth higher than its distribution is supplied to the gate. Meanwhile, in the first embodiment, write operations are performed on selected memory cells M sequentially from the one closest to the source line SL (i.e., memory cell M0) (which is referred to as a sequential writing).

Here, define a voltage Vread and a voltage Vcg that will be used in the following description of a read operation. The voltage Vread represents a voltage at which any cell written with "1" data and any cell written with "0" data will be both turned on. The voltage Vcg represents a voltage at which any cell written with "1" data will be turned on, while any cell written with "0" data will be turned off.

As illustrated in FIG. 7, in a read operation, at time t11, the control signal generation circuit 16 first supplies a voltage Vsg (e.g., 4 V) to the select gate line SGD to make the select transistor S2 conductive. Then, at time t12, the control signal generation circuit 16 supplies a voltage Vcg (e.g., 0.4 V) to a selected word line WL, while supplying a voltage Vread (e.g., 5 V) to the other unselected word lines WL uniformly.

Subsequently, at time t13, the control signal generation circuit 16 charges the bit lines BL to a certain pre-charge voltage (e.g., 1 V). Then, after the bit lines BL are charged, at time t14, the control signal generation circuit 16 supplies the voltage Vsg to the select gate line SGS to make the select transistor S1 conductive. At this point, the common source line SRC is set at a lower voltage relative to the charged bit lines BL.

After time t14, because unselected memory cells M should be turned on with the voltage Vread, whether a sufficient current flows from the bit lines BL through the cells into the source line SL depends on whether the selected memory cell M is turned on or off. If there is any current path between the source line SL and the bit lines BL, then the potential of the bit lines would decrease due to discharge. If not, there would be little change in the potential of the bit lines. The sense amplifiers 12 read data by sensing the bit lines BL for such a change in the potential of the bit lines BL. This is a reading procedure.

Figure 8:
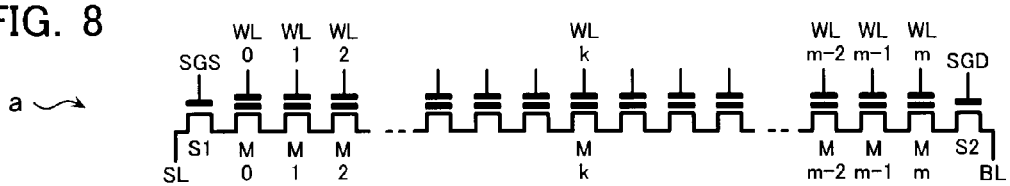
FIG. 8 illustrates voltages applied at the time of a read operation of the non-volatile semiconductor storage device according to the first embodiment.
Figure 8:
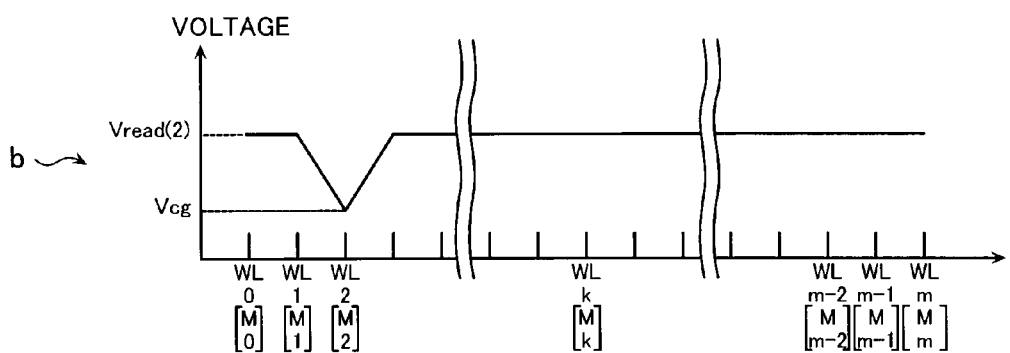
Figure 8:
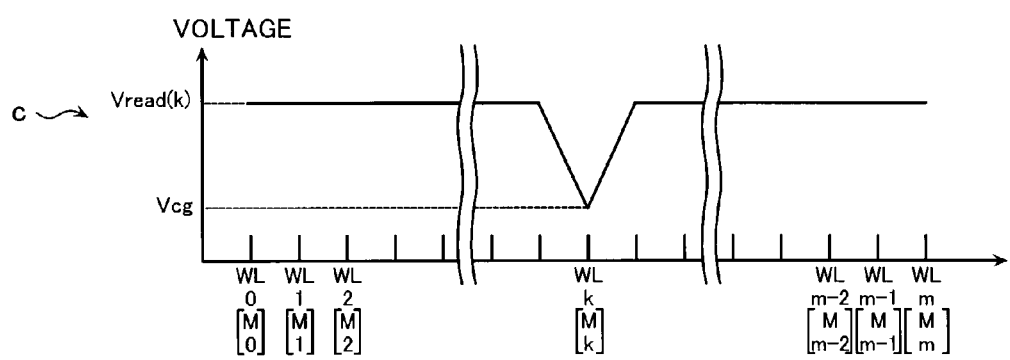
Figure 8:
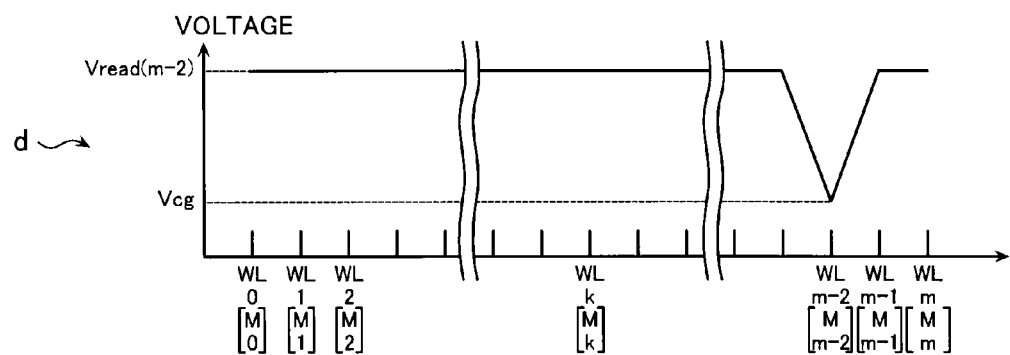

Referring now to FIG. 8, the following description will be made on voltages applied when reading respective memory cells M0 to Mm in a NAND cell unit NU. A label "a" of FIG. 8 indicates a relation among memory cells M0 to Mm and word lines WL0 to WLm. A label "b" of FIG. 8 indicates voltages applied to the word lines WL0 to WLm when a memory cell M2 close to the source line SL is selected. A label "c" of FIG. 8 indicates voltages applied to the word lines WL0 to WLm when a memory cell Mk that is closer to the bit line BL than the memory cell M2 is selected (where 2<k<m−2). A label "d" of FIG. 8 indicates voltages applied to the word lines WL0 to WLm when a memory cell Mm−2 close to the bit line BL is selected.

As indicated by the label "b" of FIG. 8, if the memory cell M2 is selected to read data therefrom, then the voltage Vcg is applied to the selected word line WL2, and a voltage Vread(2) is applied to the unselected word lines WL0, WL1, and WL3 to WLm.

On the other hand, as indicated by the label "c" of FIG. 8, if the memory cell Mk is selected to read data therefrom, then the voltage Vcg is applied to the selected word line WLk. This point is similar to that indicated by the label "b" of FIG. 8. However, a voltage Vread(k) is applied to the unselected word lines WL0 to WLk−1 and WLk+1 to WLm. This voltage Vread(k) is larger than the voltage Vread(2).

In addition, as indicated by the label "d" of FIG. 8, if memory cell Mm−2 is selected to read data therefrom, then the voltage Vcg is applied to the selected word line WLm−2. This point is similar to that indicated by the label "b" of FIG.

8. However, a voltage Vread(m−2) is applied to the unselected word lines WL0 to WLm−3, WLm−1, and WLm. This voltage Vread(m−2) is larger than the voltage Vread(k).

That is, the control signal generation circuit 16 applies a higher voltage to the gates of the unselected memory cells M at the time of the read operation as the selected memory cell M is closer to the bit line BL. In other words, a read pass voltage applied to the gates of the unselected memory cells M when reading a memory cell Mk as a selected memory cell is higher than that applied to the gates of the unselected memory cells M when reading a memory cell Mk−1 closer to the source line SL than the memory cell Mk as a selected memory cell.

[Advantages of Non-Volatile Semiconductor Storage Device in First Embodiment]

Advantages of the non-volatile semiconductor storage device according to the first embodiment will be described below. Conventionally, due to the effects of a sequential writing, the closer a memory cell M is to the source line SL, the more times the voltage Vpass is applied to that memory cell M after "0" data is written thereto. As such, the memory cell M has a higher threshold voltage as compared with other memory cells closer to the bit line BL written with "0" data. That is, when a data read operation is performed after completion of a write operation in one NAND cell unit NU, the total resistance value of unselected memory cells in one NAND cell unit NU becomes higher as the selected memory cell M is closer to the bit line BL, as long as the voltage Vread has a constant value. Therefore, if the read operation is performed under the same conditions, a read current becomes smaller when the selected memory cell M is closer to the bit line BL rather than the source line SL. That is, there are variations in read currents depending on the position of the selected memory cell M.

In contrast, the non-volatile semiconductor storage device according to the first embodiment increases the value of the voltage Vread to be applied to the gates of the unselected memory cells M at the time of a read operation as the selected memory cell M is closer to the bit line BL. Consequently, the non-volatile semiconductor storage device according to the first embodiment may address the above-mentioned problem and provide accurate sensing of changes in the potential of the bit line BL.

[Second Embodiment]

[Configuration of Non-Volatile Semiconductor Storage Device in Second Embodiment]

The non-volatile semiconductor storage device according to a second embodiment will now be described below. The non-volatile semiconductor storage device according to the second embodiment comprises the components similar to those described in the first embodiment, and is only different from the first embodiment in operation. Note that the components similar to the first embodiment are denoted with the same reference numerals in the second embodiment, and description thereof will be omitted.

[Operation of Non-Volatile Semiconductor Storage Device in Second Embodiment]

Figure 9:
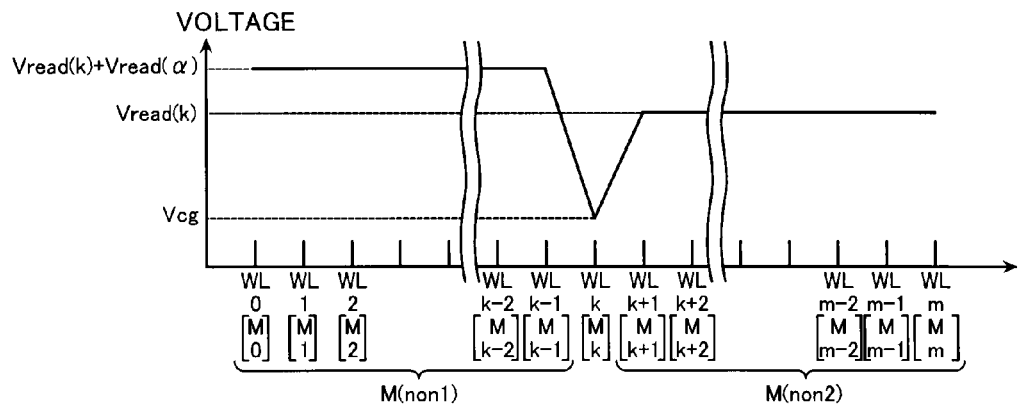
FIG. 9 illustrates voltages applied at the time of a read operation of the non-volatile semiconductor storage device according to a second embodiment.

The following description will be made on an operation of the non-volatile semiconductor storage device according to the second embodiment. The non-volatile semiconductor storage device according to the second embodiment performs a sequential writing in a similar manner to the first embodiment. As indicated by the labels a-d of FIG. 8, the non-volatile semiconductor storage device applies a higher voltage to the gates of the unselected memory cells M at the time of a read operation as the selected memory cell M is closer to the bit line BL. Referring now to FIG. 9, the following description will be made on differences from the above embodiment in a read operation of the non-volatile semiconductor storage device according to the second embodiment.

FIG. 9 illustrates a case where the memory cell Mk is selected and read. As illustrated in FIG. 9, the control signal generation circuit 16 applies the voltage Vcg to the selected word line WLk. On the other hand, the control signal generation circuit 16 applies a voltage Vread(k)+Vread(α) (where Vread(α)>0) to the unselected word lines WL0 to WLk−1 and the voltage Vread(k) to WLk+1 to WLm.

That is, in FIG. 9, unselected memory cells M0 to Mk−1 that are located on the side close to the source line SL from the selected memory cell Mk are defined as an unselected memory cell M(non1), while unselected memory cells Mk+1 to Mm that are located on the side close to the bit line BL from the selected memory cell Mk are defined as an unselected memory cell M(non2). In this case, the control signal generation circuit 16 is configured to apply a higher voltage to the gate of the unselected memory cell M(non1) than that applied to the gate of the unselected memory cell M(non2) (Vread(k)+Vread(α)>Vread(k)).

[Advantages of Non-Volatile Semiconductor Storage Device in Second Embodiment]

The non-volatile semiconductor storage device according to the second embodiment has the same advantages as the first embodiment. Moreover, the second embodiment may control voltages as illustrated in FIG. 9, and may increase the current flowing through a NAND cell unit NU due to the back-gate effect as compared with the first embodiment.

[Third Embodiment]

[Configuration of Non-Volatile Semiconductor Storage Device in Third Embodiment]

The non-volatile semiconductor storage device according to a third embodiment will now be described below. The non-volatile semiconductor storage device according to the third embodiment comprises the components similar to those described in the first embodiment, and is only different from the first embodiment in operation. Note that the components similar to the first and second embodiments are denoted with the same reference numerals in the third embodiment, and description thereof will be omitted.

[Operation of Non-Volatile Semiconductor Storage Device in Third Embodiment]

Figure 10:
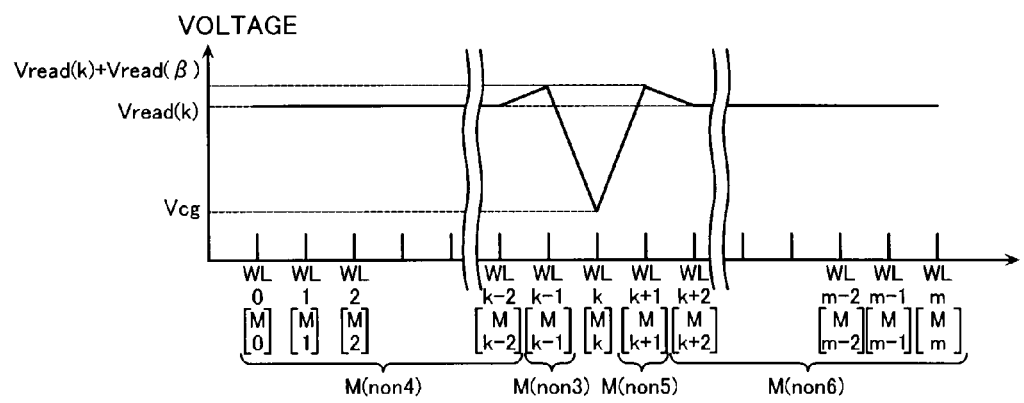
FIG. 10 illustrates voltages applied at the time of a read operation of the non-volatile semiconductor storage device according to a third embodiment.

The following description will be made on an operation of the non-volatile semiconductor storage device according to the third embodiment. The non-volatile semiconductor storage device according to the third embodiment performs a sequential writing in a similar manner to the first embodiment. As indicated by the labels a-d of FIG. 8, the non-volatile semiconductor storage device applies a higher voltage to the gates of the unselected memory cells M at the time of a read operation as the selected memory cell M is closer to the bit line BL. Referring now to FIG. 10, the following description will be made on differences from the above embodiments in a read operation of the non-volatile semiconductor storage device according to the third embodiment.

FIG. 10 illustrates a case where the memory cell Mk is selected and read. As illustrated in FIG. 10, the control signal generation circuit 16 applies the voltage Vcg to the selected word line WLk. On the other hand, the control signal generation circuit 16 applies the voltage Vread(k) to the unselected word lines WL0 to WLk−2 and a voltage Vread(k)+Vread(β) (where Vread(β)>0) to the unselected word line WLk−1 adjacent to the selected word line WLk. The control signal generation circuit 16 also applies a voltage Vread(k)+Vread(β) to the unselected word line WLk+1 adjacent to the selected word line WLk and the voltage Vread(k) to the unselected word lines WLk+2 to WLm.

That is, in FIG. 10, an unselected memory cell Mk−1 that is adjacent to the selected memory cell Mk on the side close to the source line SL as viewed from the selected memory cell Mk is defined as an unselected memory cell M(non3), while unselected memory cells M0 to Mk−2 that are located on the side close to the source line SL as viewed from that unselected memory cell M(non3) are defined as an unselected memory cell M(non4). In addition, an unselected memory cell Mk+1 that is adjacent to the selected memory cell Mk on the side close to the bit line BL as viewed from the selected memory cell Mk is defined as an unselected memory cell M(non5), while unselected memory cells Mk+2 to Mm that are located on the side close to the bit line BL as viewed from that unselected memory cell M(non5) are defined as an unselected memory cell M(non6). In this case, the control signal generation circuit 16 is configured to apply a higher voltage to the gate of the unselected memory cell M(non3) than that applied to the gate of the unselected memory cell M(non4) (Vread(k)+Vread($\beta$)>Vread(k)). The control signal generation circuit 16 is also configured to apply a higher voltage to the gate of the unselected memory cell M(non5) than that applied to the gate of the unselected memory cell M(non6) (Vread(k)+Vread($\beta$)>Vread(k)).

[Advantages of Non-Volatile Semiconductor Storage Device in Third Embodiment]

The non-volatile semiconductor storage device according to the third embodiment has the same advantages as the first embodiment. In addition to this, the third embodiment has an advantage that the voltage of the floating gates of the unselected memory cells Mk−1 and Mk+1 adjacent to the selected memory cell Mk will be constant with the voltages of the floating gates of the other unselected memory cells. This advantage will be described in more detail below with reference to FIG. 11.

Figure 11:
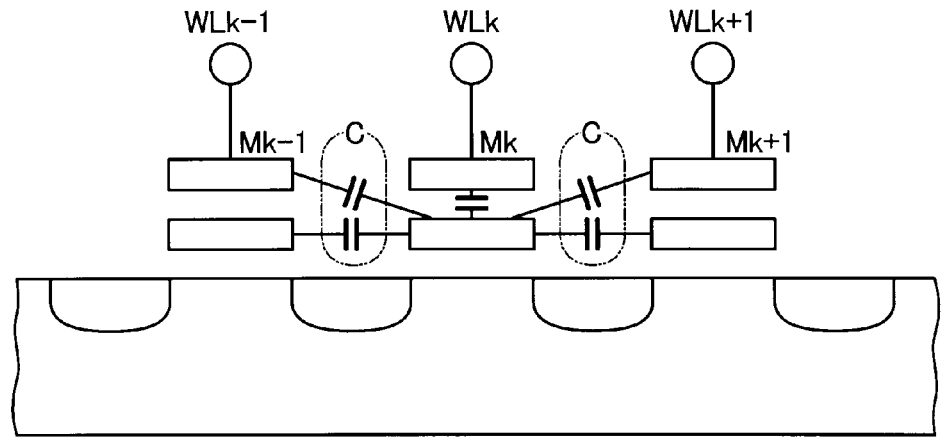
FIG. 11 illustrates couplings C provided between memory cells M.

The gate of the selected memory cell Mk is applied with the voltage Vcg lower than that applied to the gates of the unselected memory cells Mk−1 and Mk+1 adjacent thereto. Accordingly, as illustrated in FIG. 11, the voltage of the floating gates of the unselected memory cells Mk−1 and Mk+1 adjacent to the selected memory cell Mk is lowered below the voltage of the floating gates of the other unselected memory cells due to the couplings C with the selected memory cell Mk.

In contrast, the third embodiment addresses this problem by setting the voltage applied to the gates of the unselected memory cells Mk−1 and Mk+1 adjacent to the selected memory cell Mk to be higher than that applied to the selected memory cell Mk.

[Fourth Embodiment]

[Configuration of Non-Volatile Semiconductor Storage Device in Fourth Embodiment]

The non-volatile semiconductor storage device according to a fourth embodiment will now be described below. The non-volatile semiconductor storage device according to the fourth embodiment comprises the components similar to those described in the first embodiment, and is only different from the first embodiment in operation. Note that the components similar to the first to third embodiments are denoted with the same reference numerals in the fourth embodiment, and description thereof will be omitted.

[Operation of Non-Volatile Semiconductor Storage Device in Fourth Embodiment]

Figure 12:
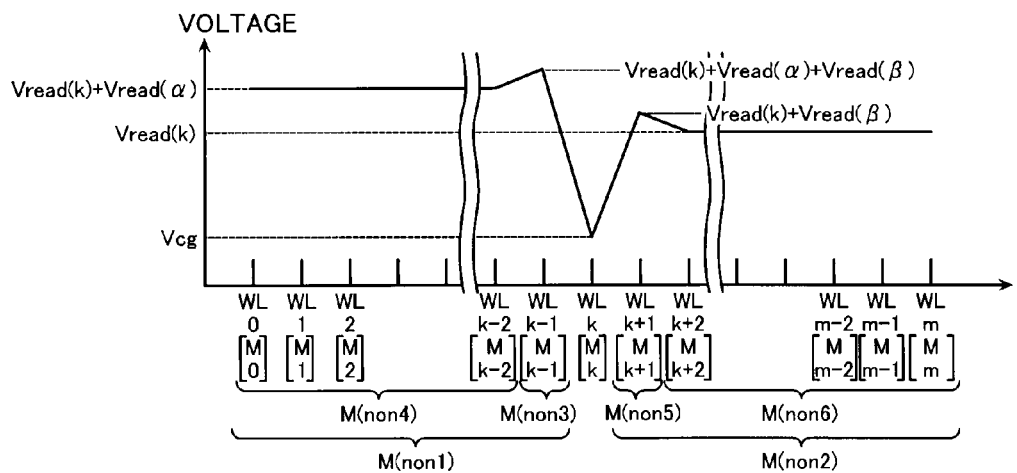
FIG. 12 illustrates voltages applied at the time of a read operation of the non-volatile semiconductor storage device according to a fourth embodiment.

The following description will be made on an operation of the non-volatile semiconductor storage device according to the fourth embodiment. The non-volatile semiconductor storage device according to the fourth embodiment performs a sequential writing in a similar manner to the first embodiment. As indicated by the labels a-d of FIG. 8, the non-volatile semiconductor storage device applies a higher voltage to the gates of the unselected memory cells M at the time of a read operation as the selected memory cell M is closer to the bit line BL. Referring now to FIG. 12, the following description will be made on differences from the above embodiments in a read operation of the non-volatile semiconductor storage device according to the fourth embodiment.

FIG. 12 illustrates a case where the memory cell Mk is selected and read. As illustrated in FIG. 12, the control signal generation circuit 16 applies the voltage Vcg to the selected word line WLk. On the other hand, the control signal generation circuit 16 applies a voltage Vread(k)+Vread($\alpha$) to the unselected word lines WL0 to WLk−2 and a voltage Vread(k)+Vread($\alpha$)+Vread($\beta$) to the unselected word line WLk−1. The control signal generation circuit 16 also applies a voltage Vread(k)+Vread($\beta$) to the unselected word line WLk+1 and the voltage Vread(k) to the unselected word lines WLk+2 to WLm.

That is, in FIG. 12, unselected memory cells M(non1) to M(non6) are defined as in the third embodiment. In this case, the control signal generation circuit 16 is configured to apply a higher voltage to the gate of the unselected memory cell M(non1) than that applied to the gate of the unselected memory cell M(non2) (Vread(k)+Vread($\alpha$)>Vread(k)). The control signal generation circuit 16 is also configured to apply a higher voltage to the gate of the unselected memory cell M(non3) than that applied to the gate of the unselected memory cell M(non4) (Vread(k)+Vread($\alpha$)+Vread($\beta$)>Vread(k)+Vread($\alpha$)). The control signal generation circuit 16 is further configured to apply a higher voltage to the gate of the unselected memory cell M(non5) than that applied to the gate of the unselected memory cell M(non6) (Vread(k)+Vread($\beta$)>Vread(k)).

[Advantages of Non-Volatile Semiconductor Storage Device in Fourth Embodiment]

The non-volatile semiconductor storage device according to the fourth embodiment has the same advantages as the first to third embodiments.

[Fifth Embodiment]

[Configuration of Non-Volatile Semiconductor Storage Device in Fifth Embodiment]

The non-volatile semiconductor storage device according to a fifth embodiment will now be described below. The non-volatile semiconductor storage device according to the fifth embodiment comprises the components similar to those described in the first embodiment, and is only different from the first embodiment in operation. Note that the components similar to the first to fourth embodiments are denoted with the same reference numerals in the fifth embodiment, and description thereof will be omitted.

[Operation of Non-Volatile Semiconductor Storage Device in Fifth Embodiment]

Figure 13:
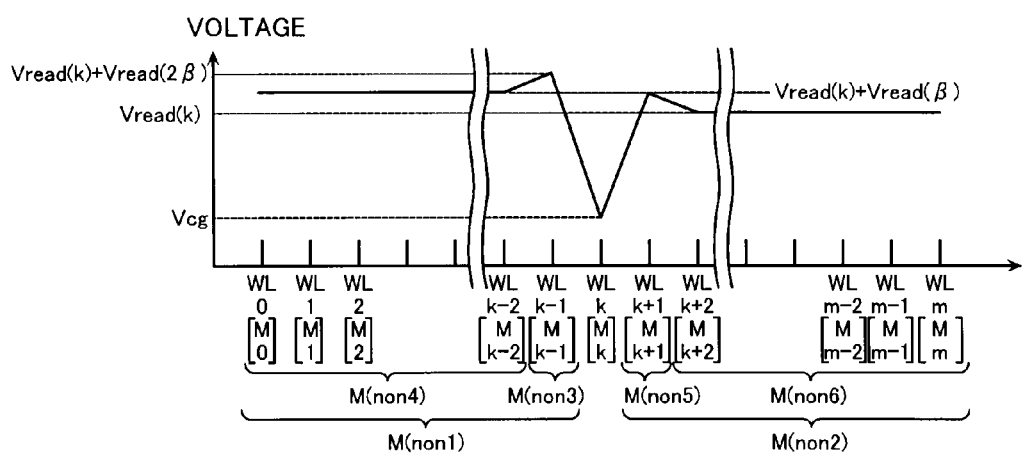
FIG. 13 illustrates voltages applied at the time of a read operation of the non-volatile semiconductor storage device according to a fifth embodiment.

The following description will be made on an operation of the non-volatile semiconductor storage device according to the fifth embodiment. The non-volatile semiconductor storage device according to the fifth embodiment performs a sequential writing in a similar manner to the first embodiment. As indicated by the labels a-d of FIG. 8, the non-volatile semiconductor storage device applies a higher voltage to the gates of the unselected memory cells M at the time of a read operation as the selected memory cell M is closer to the bit line BL. Referring now to FIG. 13, the following description will be made on differences from the above embodiments in a read operation of the non-volatile semiconductor storage device according to the fifth embodiment.

FIG. 13 illustrates a case where the memory cell Mk is selected and read. As illustrated in FIG. 13, the control signal generation circuit 16 applies the voltage Vcg to the selected word line WLk. On the other hand, the control signal generation circuit 16 applies a voltage Vread(k)+Vread(β) to the unselected word lines WL0 to WLk−2 and a voltage Vread(k)+Vread(2β) (where Vread(2β)>0) to the unselected word line WLk−1. The control signal generation circuit 16 also applies a voltage Vread(k)+Vread(β) to the unselected word line WLk+1 and the voltage Vread(k) to the unselected word lines WLk+2 to WLm.

That is, in FIG. 13, unselected memory cells M(non1) to M(non6) are defined as in the second and third embodiments. In this case, the control signal generation circuit 16 is configured to apply a higher voltage to the gate of the unselected memory cell M(non4) than that applied to the gate of the unselected memory cell M(non6) (Vread(k)+Vread(2β)>Vread(k)). The control signal generation circuit 16 is also configured to apply a higher voltage to the gate of the unselected memory cell M(non3) than that applied to the gate of the unselected memory cell M(non4) (Vread(k)+Vread(2β)>Vread(k)+Vread(β)). The control signal generation circuit 16 is further configured to apply a higher voltage to the gate of the unselected memory cell M(non5) than that applied to the gate of the unselected memory cell M(non6) (Vread(k)+Vread(β)>Vread(k)). Moreover, the control signal generation circuit 16 is configured to apply the same voltage to the gate of the unselected memory cell M(non4) and to the gate of the unselected memory cell M(non5) (Vread(k)+Vread(β)=Vread(k)+Vread(β)).

[Advantages of Non-Volatile Semiconductor Storage Device in Fifth Embodiment]

The non-volatile semiconductor storage device according to the fifth embodiment has the same advantages as the fourth embodiment. Moreover, the non-volatile semiconductor storage device according to the fifth embodiment may perform a read operation with four kinds of voltages, i.e., fewer kinds of voltages as compared with the fourth embodiment where five kinds of voltages are required. Accordingly, the non-volatile semiconductor storage device according to the fifth embodiment may reduce the number of boost circuits as compared with the fourth embodiment.

[Sixth Embodiment]

[Configuration of Non-Volatile Semiconductor Storage Device in Sixth Embodiment]

The non-volatile semiconductor storage device according to a sixth embodiment will now be described below. The non-volatile semiconductor storage device according to the sixth embodiment comprises the components similar to those described in the first embodiment, and is only different from the first embodiment in operation. Note that the components similar to the first to fifth embodiments are denoted with the same reference numerals in the sixth embodiment, and description thereof will be omitted.

[Operation of Non-Volatile Semiconductor Storage Device in Sixth Embodiment]

Figure 14:
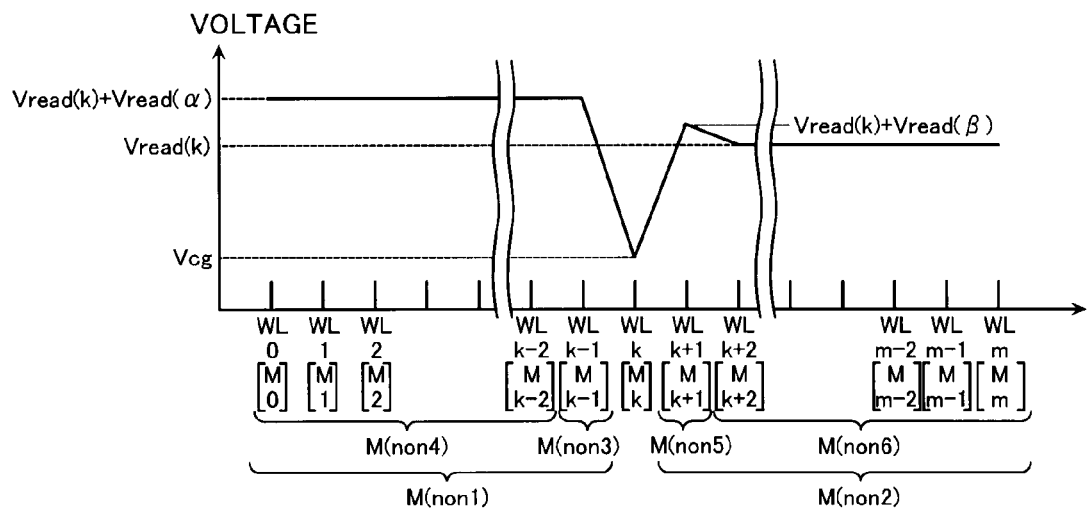
FIG. 14 illustrates voltages applied at the time of a read operation of the non-volatile semiconductor storage device according to a sixth embodiment.

The following description will be made on an operation of the non-volatile semiconductor storage device according to the sixth embodiment. The non-volatile semiconductor storage device according to the sixth embodiment performs a sequential writing in a similar manner to the first embodiment. As indicated by the labels a-d of FIG. 8, the non-volatile semiconductor storage device applies a higher voltage to the gates of the unselected memory cells M at the time of a read operation as the selected memory cell M is closer to the bit line BL. Referring now to FIG. 14, the following description will be made on differences from the above embodiments in a read operation of the non-volatile semiconductor storage device according to the sixth embodiment.

FIG. 14 illustrates a case where the memory cell Mk is selected and read. As illustrated in FIG. 14, the control signal generation circuit 16 applies the voltage Vcg to the selected word line WLk. On the other hand, the control signal generation circuit 16 applies a voltage Vread(k)+Vread(α) to the unselected word lines WL0 to WLk−1. The control signal generation circuit 16 also applies a voltage Vread(k)+Vread(β) to the unselected word line WLk+1 and the voltage Vread(k) to the unselected word lines WLk+2 to WLm.

That is, in FIG. 14, unselected memory cells M(non1) to M(non6) are defined as in the second and third embodiments. In this case, the control signal generation circuit 16 is configured to apply a higher voltage to the gate of the unselected memory cell M(non1) than that applied to the gate of the unselected memory cell M(non2) (Vread(k)+Vread(α)>Vread(k)). The control signal generation circuit 16 is also configured to apply a higher voltage to the gate of the unselected memory cell M(non5) than that applied to the gate of the unselected memory cell M(non6) (Vread(k)+Vread(β)>Vread(k)).

[Advantages of Non-Volatile Semiconductor Storage Device in Sixth Embodiment]

The non-volatile semiconductor storage device according to the sixth embodiment has the same advantages as the fourth embodiment. Moreover, the non-volatile semiconductor storage device according to the sixth embodiment may perform a read operation with four kinds of voltages, i.e., fewer kinds of voltages as compared with the fourth embodiment where five kinds of voltages are required. Accordingly, the non-volatile semiconductor storage device according to the sixth embodiment may reduce the number of boost circuits as compared with the fourth embodiment.

[Seventh Embodiment]

[Configuration of Non-Volatile Semiconductor Storage Device in Seventh Embodiment]

The non-volatile semiconductor storage device according to a seventh embodiment will now be described below. The non-volatile semiconductor storage device according to the seventh embodiment comprises the components similar to those described in the first embodiment, and is only different from the first embodiment in operation. Note that the components similar to the first to sixth embodiments are denoted with the same reference numerals in the seventh embodiment, and description thereof will be omitted.

[Operation of Non-Volatile Semiconductor Storage Device in Seventh Embodiment]

Figure 15:
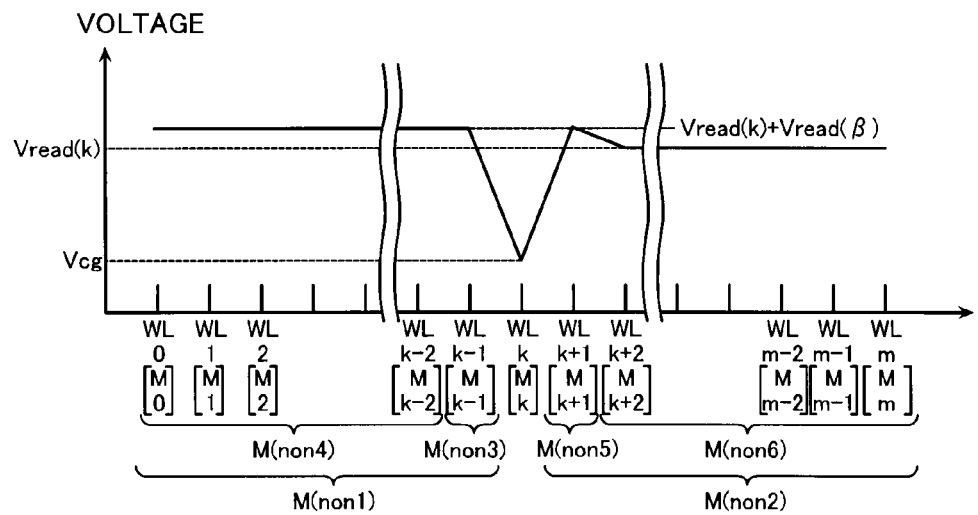
FIG. 15 illustrates voltages applied at the time of a read operation of the non-volatile semiconductor storage device according to a seventh embodiment.

The following description will be made on an operation of the non-volatile semiconductor storage device according to the seventh embodiment. The non-volatile semiconductor storage device according to the seventh embodiment performs a sequential writing in a similar manner to the first embodiment. As indicated by the labels a-d of FIG. 8, the non-volatile semiconductor storage device applies a higher voltage to the gates of the unselected memory cells M at the time of a read operation as the selected memory cell M is closer to the bit line BL. Referring now to FIG. 15, the following description will be made on differences from the above embodiments in a read operation of the non-volatile semiconductor storage device according to the seventh embodiment.

FIG. 15 illustrates a case where the memory cell Mk is selected and read. As illustrated in FIG. 15, the control signal generation circuit 16 applies the voltage Vcg to the selected word line WLk. On the other hand, the control signal generation circuit 16 applies a voltage Vread(k)+Vread(β) to the unselected word lines WL0 to WLk−1. The control signal generation circuit 16 also applies a voltage Vread(k)+Vread(β) to the unselected word line WLk+1 and the voltage Vread(k) to the unselected word lines WLk+2 to WLm.

That is, in FIG. 15, unselected memory cells M(non1) to M(non6) are defined as in the second and third embodiments. In this case, the control signal generation circuit 16 is configured to apply a higher voltage to the gate of the unselected memory cell M(non1) than that applied to the gate of the unselected memory cell M(non6) (Vread(k)+Vread(β)>Vread(k)). The control signal generation circuit 16 is also configured to apply a higher voltage to the gate of the unselected memory cell M(non5) than that applied to the gate of the unselected memory cell M(non6) (Vread(k)+Vread(β)>Vread(k)). The control signal generation circuit 16 is further configured to apply the same voltage to the gate of the unselected memory cell M(non4) and to the gate of the unselected memory cell M(non5) (Vread(k)+Vread(β)=Vread(k)+Vread(β)).

[Advantages of Non-Volatile Semiconductor Storage Device in Seventh Embodiment]

The non-volatile semiconductor storage device according to the seventh embodiment has the same advantages as the first to third embodiments. Moreover, the non-volatile semiconductor storage device according to the seventh embodiment may perform a read operation with three kinds of voltages, i.e., fewer kinds of voltages as compared with the fifth and sixth embodiments where four kinds of voltages are required. Accordingly, the non-volatile semiconductor storage device according to the seventh embodiment may further reduce the number of boost circuits when compared with the fifth and sixth embodiments.

[Eighth Embodiment]

[Configuration of Non-Volatile Semiconductor Storage Device in Eighth Embodiment]

A configuration of the non-volatile semiconductor storage device according to an eighth embodiment will now be described below. The non-volatile semiconductor storage device according to the eighth embodiment is different from the first embodiment only in the configuration of the memory cell array 11. Note that the components similar to the first to seventh embodiments are denoted with the same reference numerals in the eighth embodiment, and description thereof will be omitted.

Figure 16:
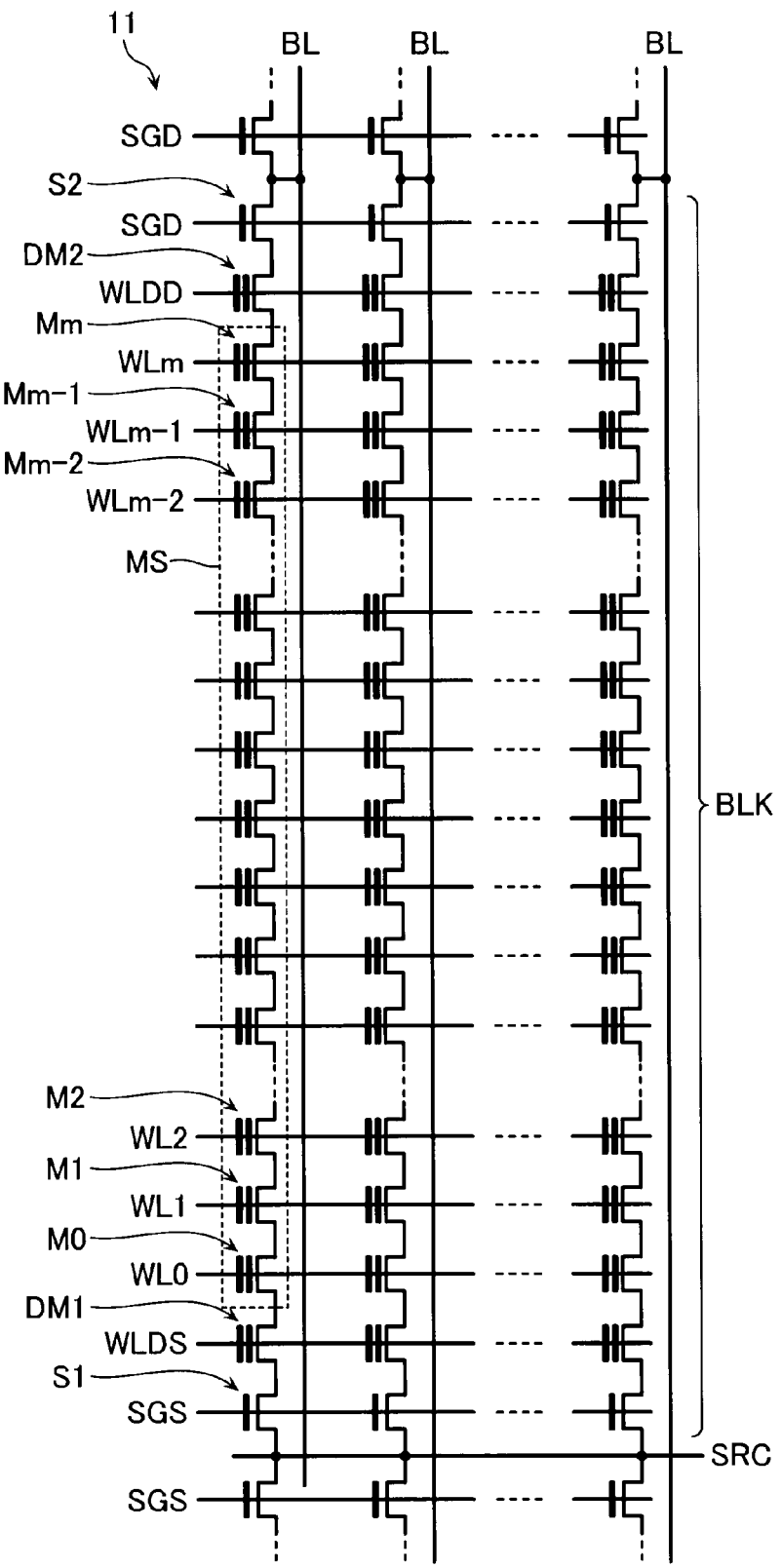
FIG. 16 is an equivalent circuit diagram illustrating a memory cell array 11 in the memory according to an eighth embodiment.

As illustrated in FIG. 16, the memory cell array 11 has dummy memory cells DM1 and DM2. The dummy memory cells DM1 and DM2 have the same configuration as the memory cells M0 to Mm. However, the dummy memory cells DM1 and DM2 are not subject to operations such as write or read operations. The dummy memory cells DM1 and DM2 are controlled with the aim of making them always in an erased state. Each dummy memory cell DM1 is provided between a memory cell M0 and a select transistor S1. Each dummy memory cell DM2 is provided between a memory cell Mm and a select transistor S2. The gates of the dummy memory cells DM1 are connected to a dummy word line WLDS, while the gates of the dummy memory cells DM2 are connected to a dummy word line WLDD.

[Operation of Non-Volatile Semiconductor Storage Device in Eighth Embodiment]

Figure 17:
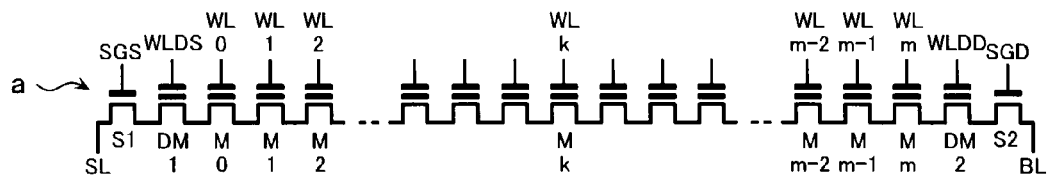
FIG. 17 illustrates voltages applied at the time of a read operation of the non-volatile semiconductor storage device according to the eighth embodiment.
Figure 17:
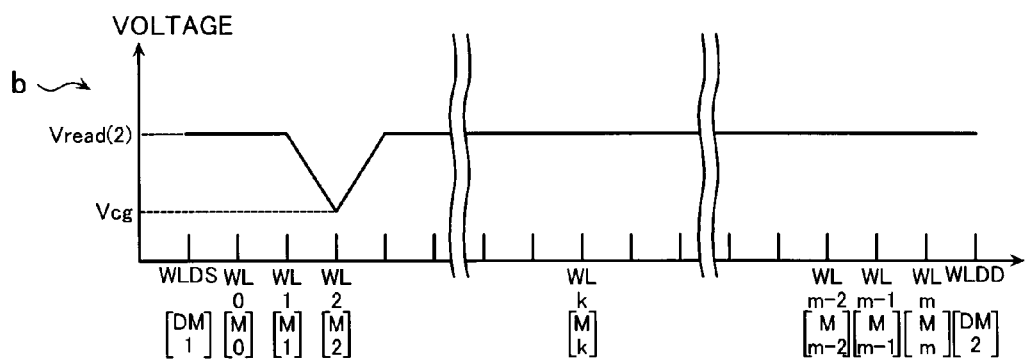
Figure 17:
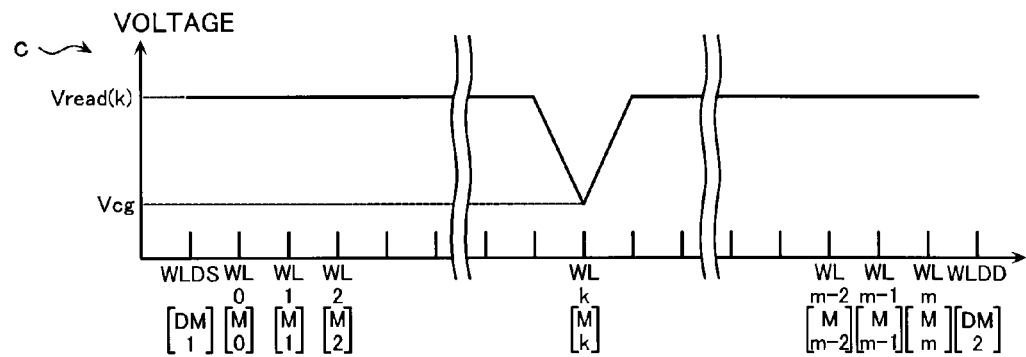
Figure 17:
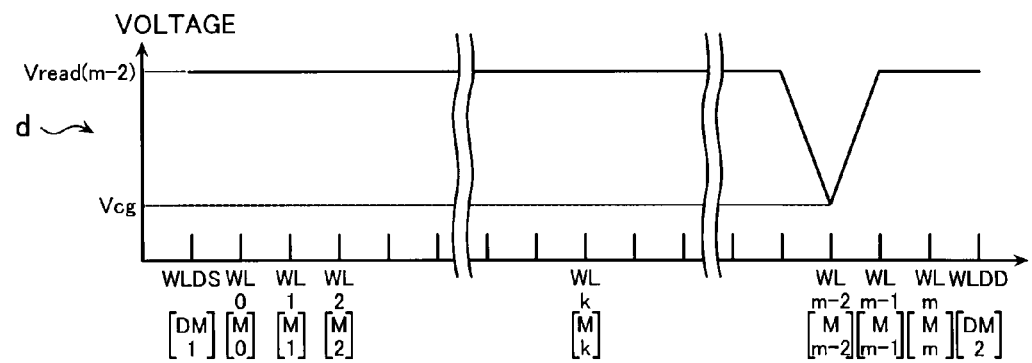

Referring now to FIG. 17, an operation of the non-volatile semiconductor storage device according to the eighth embodiment will be described below. A label "a" of FIG. 17 indicates a relation among the memory cells M0 to Mm, the word lines WL0 to WLm, the dummy memory cells DM1, DM2, and the dummy word lines WLDS, WLDD. A label "b" of FIG. 17 indicates voltages applied to the word lines WL0 to WLm and the dummy word lines WLDS and WLDD when a memory cell M2 close to the source line SL is selected. A label "c" of FIG. 17 indicates voltages applied to the word lines WL0 to WLm and the dummy word lines WLDS and WLDD when a memory cell Mk that is closer to the bit line BL than the memory cell M2 is selected. A label "d" of FIG. 17 indicates voltages applied to the word lines WL0 to WLm and the dummy word lines WLDS and WLDD when a memory cell Mm−2 close to the bit line BL is selected.

The non-volatile semiconductor storage device according to the eighth embodiment performs a sequential writing in a similar manner to the first embodiment. Likewise, as indicated by the labels a-d of FIG. 17, the non-volatile semiconductor storage device according to the eighth embodiment also applies a higher voltage to the gates of the unselected memory cells M at the time of a read operation as the selected memory cell M is closer to the bit line BL. In addition to this, the non-volatile semiconductor storage device according to the eighth embodiment also applies respective voltages Vread(2), Vread(k), and Vread(m−2) that are applied to the unselected memory cells M during read operations to the dummy word lines WLDS and WLDD (the gates of the dummy memory cells DM1 and DM2).

[Advantages of Non-Volatile Semiconductor Storage Device in Eighth Embodiment]

The non-volatile semiconductor storage device according to the eighth embodiment has the same advantages as the first embodiment. Moreover, the non-volatile semiconductor storage device according to the eighth embodiment provides the dummy memory cells DM1 and DM2 at those regions subjected to leakage currents from the select transistors S1 and S2. As a result, the eighth embodiment may mitigate the effects of leakage currents on the memory cells M0 to Mm, achieving higher reliability than the first embodiment. In addition, the eighth embodiment applies the same voltage to the dummy word lines WLDS and WLDD as that applied to the unselected memory cells M0 and Mm. Accordingly, the eighth embodiment may further reduce the number of boost circuits when compared with the case of applying other voltages to the dummy word lines WLDS and WLDD.

[Ninth Embodiment]

[Configuration of Non-Volatile Semiconductor Storage Device in Ninth Embodiment]

The non-volatile semiconductor storage device according to a ninth embodiment will now be described below. The non-volatile semiconductor storage device according to the ninth embodiment comprises the components similar to those described in the eighth embodiment, and is only different from the eighth embodiment in operation. Note that the components similar to the first to eighth embodiments are denoted with the same reference numerals in the ninth embodiment, and description thereof will be omitted.

[Operation of Non-Volatile Semiconductor Storage Device in Ninth Embodiment]

Figure 18:
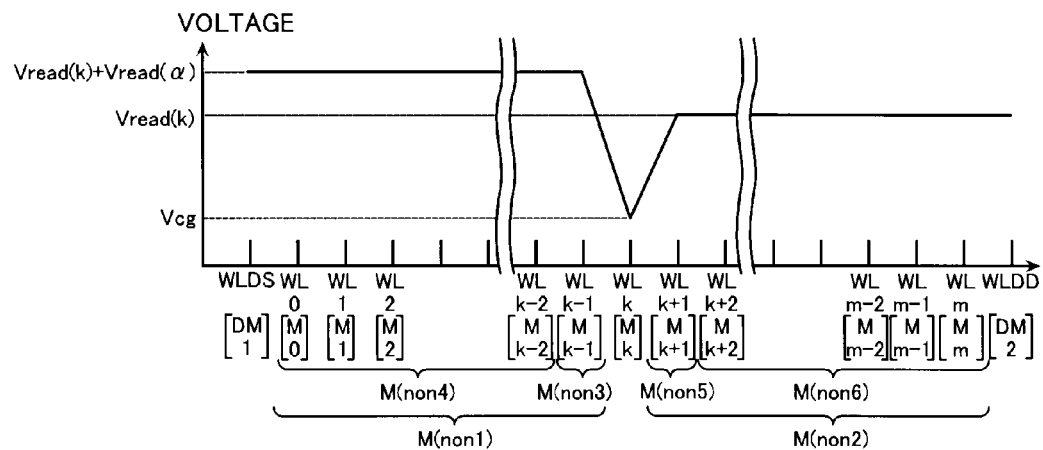
FIG. 18 illustrates voltages applied at the time of a read operation of the non-volatile semiconductor storage device according to a ninth embodiment.

The following description will be made on an operation of the non-volatile semiconductor storage device according to the ninth embodiment. The non-volatile semiconductor storage device according to the ninth embodiment performs a sequential writing in a similar manner to the first embodiment. As indicated by the labels a-d of FIG. 17, the non-volatile semiconductor storage device applies a higher voltage to the gates of the unselected memory cells M at the time of a read operation as the selected memory cell M is closer to the bit line BL. Referring now to FIG. 18, the following description will be made on differences from the above embodiments in a read operation of the non-volatile semiconductor storage device according to the ninth embodiment.

FIG. 18 illustrates a case where the memory cell Mk is selected and read. As illustrated in FIG. 18, the control signal generation circuit 16 applies the same voltages as those described in the second embodiment to the word lines WL0 to WLm (the gates of the memory cells M0 to Mm). In addition, the control signal generation circuit 16 applies the same voltage Vread(k)+Vread(α) as that of the word line WL0 to the dummy word line WLDS (the gates of the dummy memory cells DM1). Furthermore, the control signal generation circuit 16 applies the same voltage Vread(k) as that of the word line WLm to the dummy word line WLDD (the gates of the dummy memory cells DM2).

[Advantages of Non-Volatile Semiconductor Storage Device in Ninth Embodiment]

The non-volatile semiconductor storage device according to the ninth embodiment has the same advantages as the second and eighth embodiments.

[b 10th Embodiment]

[Configuration of Non-Volatile Semiconductor Storage Device in 10th Embodiment]

The non-volatile semiconductor storage device according to a 10th embodiment will now be described below. The non-volatile semiconductor storage device according to the 10th embodiment comprises the components similar to those described in the eighth embodiment, and is only different from the eighth embodiment in operation. Note that the components similar to the first to ninth embodiments are denoted with the same reference numerals in the 10th embodiment, and description thereof will be omitted.

[Operation of Non-Volatile Semiconductor Storage Device in 10th Embodiment]

Figure 19:
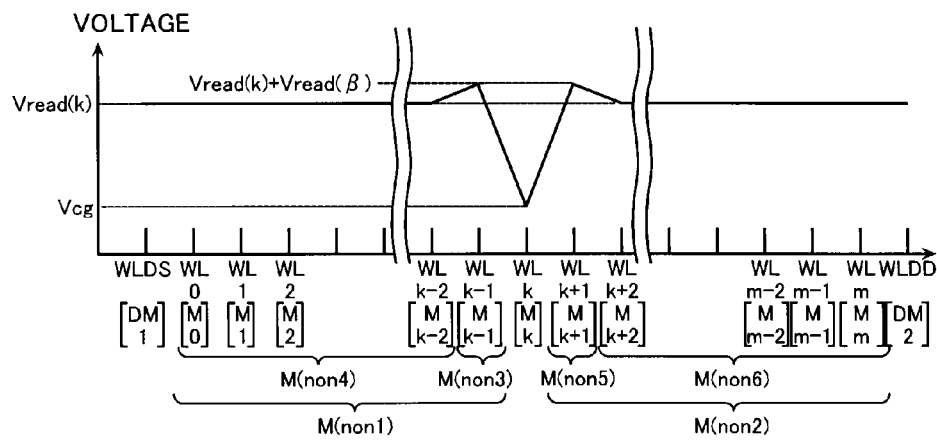
FIG. 19 illustrates voltages applied at the time of a read operation of the non-volatile semiconductor storage device according to a 10th embodiment.

The following description will be made on an operation of the non-volatile semiconductor storage device according to the 10th embodiment. The non-volatile semiconductor storage device according to the 10th embodiment performs a sequential writing in a similar manner to the first embodiment. As indicated by the labels a-d of FIG. 17, the non-volatile semiconductor storage device applies a higher voltage to the gates of the unselected memory cells M at the time of a read operation as the selected memory cell M is closer to the bit line BL. Referring now to FIG. 19, the following description will be made on differences from the above embodiments in a read operation of the non-volatile semiconductor storage device according to the 10th embodiment.

FIG. 19 illustrates a case where the memory cell Mk is selected and read. As illustrated in FIG. 19, the control signal generation circuit 16 applies the same voltages as those described in the third embodiment to the word lines WL0 to WLm (the gates of the memory cells M0 to Mm). In addition, the control signal generation circuit 16 applies the same voltage Vread(k) as that of the word line WL0 to the dummy word line WLDS (the gates of the dummy memory cells DM1). Furthermore, the control signal generation circuit 16 applies the same voltage Vread(k) as that of the word line WLm to the dummy word line WLDD (the gates of the dummy memory cells DM2).

[Advantages of Non-Volatile Semiconductor Storage Device in 10th Embodiment]

The non-volatile semiconductor storage device according to the 10th embodiment has the same advantages as the third and eighth embodiments.

[11th Embodiment]

[Configuration of Non-Volatile Semiconductor Storage Device in 11th Embodiment]

The non-volatile semiconductor storage device according to an 11th embodiment will now be described below. The non-volatile semiconductor storage device according to the 11th embodiment comprises the components similar to those described in the eighth embodiment, and is only different from the eighth embodiment in operation. Note that the components similar to the first to 10th embodiments are denoted with the same reference numerals in the 11th embodiment, and description thereof will be omitted.

[Operation of Non-Volatile Semiconductor Storage Device in 11th Embodiment]

Figure 20:
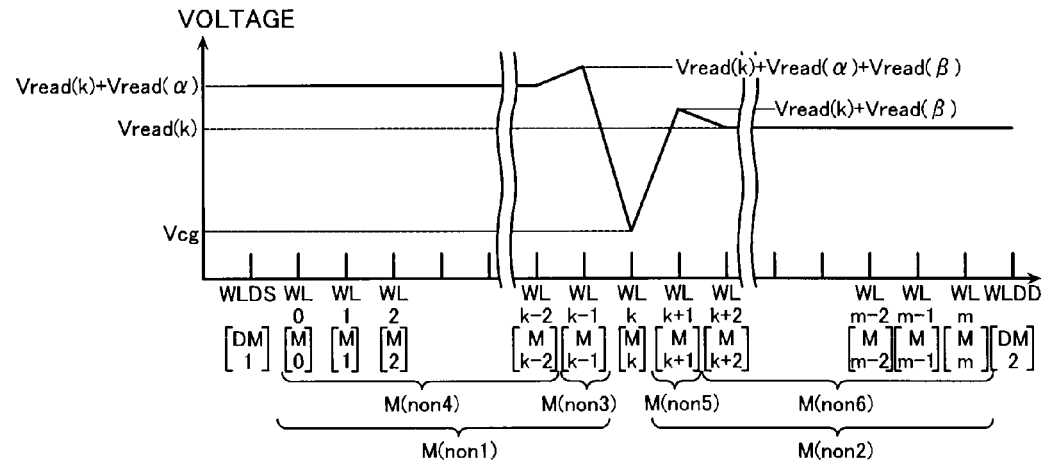
FIG. 20 illustrates voltages applied at the time of a read operation of the non-volatile semiconductor storage device according to an 11th embodiment.

The following description will be made on an operation of the non-volatile semiconductor storage device according to the 11th embodiment. The non-volatile semiconductor storage device according to the 11th embodiment performs a sequential writing in a similar manner to the first embodiment. As indicated by the labels a-d of FIG. 17, the non-volatile semiconductor storage device applies a higher voltage to the gates of the unselected memory cells M at the time of a read operation as the selected memory cell M is closer to the bit line BL. Referring now to FIG. 20, the following description will be made on differences from the above embodiments in a read operation of the non-volatile semiconductor storage device according to the 11th embodiment.

FIG. 20 illustrates a case where the memory cell Mk is selected and read. As illustrated in FIG. 20, the control signal generation circuit 16 applies the same voltages as those described in the fourth embodiment to the word lines WL0 to WLm (the gates of the memory cells M0 to Mm). In addition, the control signal generation circuit 16 applies the same voltage Vread(k)+Vread(α) as that of the word line WL0 to the dummy word line WLDS (the gates of the dummy memory cells DM1). Furthermore, the control signal generation circuit 16 applies the same voltage Vread(k) as that of the word line WLm to the dummy word line WLDD (the gates of the dummy memory cells DM2).

[Advantages of Non-Volatile Semiconductor Storage Device in 11th Embodiment]

The non-volatile semiconductor storage device according to the 11th embodiment has the same advantages as the fourth and eighth embodiments.

12th Embodiment

Configuration of Non-Volatile Semiconductor Storage Device in 12th Embodiment

The non-volatile semiconductor storage device according to a 12th embodiment will now be described below. The non-volatile semiconductor storage device according to the 12th embodiment comprises the components similar to those described in the eighth embodiment, and is only different from the eighth embodiment in operation. Note that the components similar to the first to 11th embodiments are denoted with the same reference numerals in the 12th embodiment, and description thereof will be omitted.

[Operation of Non-Volatile Semiconductor Storage Device in 12th Embodiment]

Figure 21:
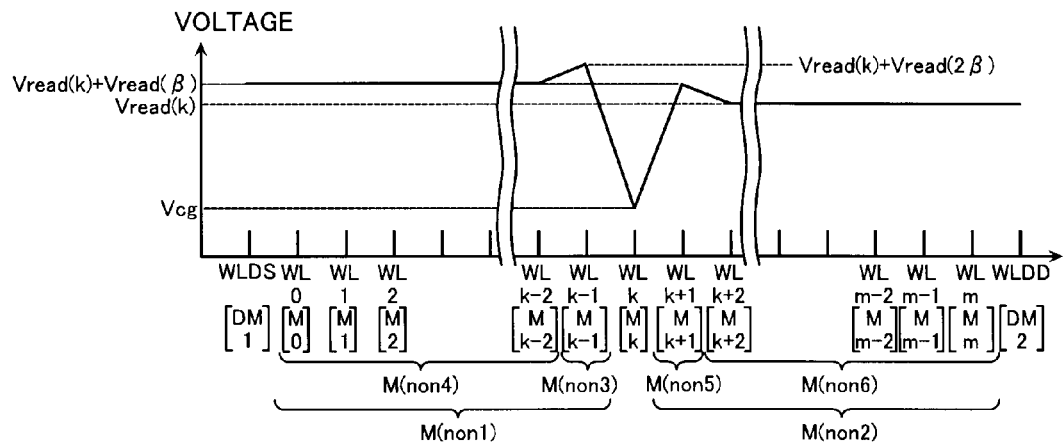
FIG. 21 illustrates voltages applied at the time of a read operation of the non-volatile semiconductor storage device according to a 12th embodiment.

The following description will be made on an operation of the non-volatile semiconductor storage device according to the 12th embodiment. The non-volatile semiconductor storage device according to the 12th embodiment performs a sequential writing in a similar manner to the first embodiment. As indicated by the labels a-d of FIG. 17, the non-volatile semiconductor storage device applies a higher voltage to the gates of the unselected memory cells M at the time of a read operation as the selected memory cell M is closer to the bit line BL. Referring now to FIG. 21, the following description will be made on differences from the above embodiments in a read operation of the non-volatile semiconductor storage device according to the 12th embodiment.

FIG. 21 illustrates a case where the memory cell Mk is selected and read. As illustrated in FIG. 21, the control signal generation circuit 16 applies the same voltages as those described in the fifth embodiment to the word lines WL0 to WLm (the gates of the memory cells M0 to Mm). In addition, the control signal generation circuit 16 applies the same voltage Vread(k)+Vread($\beta$) as that of the word line WL0 to the dummy word line WLDS (the gates of the dummy memory cells DM1). Furthermore, the control signal generation circuit 16 applies the same voltage Vread(k) as that of the word line WLm to the dummy word line WLDD (the gates of the dummy memory cells DM2).

[Advantages of Non-Volatile Semiconductor Storage Device in 12th Embodiment]

The non-volatile semiconductor storage device according to the 12th embodiment has the same advantages as the fifth and eighth embodiments.

[13th Embodiment]
[Configuration of Non-Volatile Semiconductor Storage Device in 13th Embodiment]

The non-volatile semiconductor storage device according to a 13th embodiment will now be described below. The non-volatile semiconductor storage device according to the 13th embodiment comprises the components similar to those described in the eighth embodiment, and is only different from the eighth embodiment in operation. Note that the components similar to the first to 12th embodiments are denoted with the same reference numerals in the 13th embodiment, and description thereof will be omitted.

[Operation of Non-Volatile Semiconductor Storage Device in 13th Embodiment]

Figure 22:
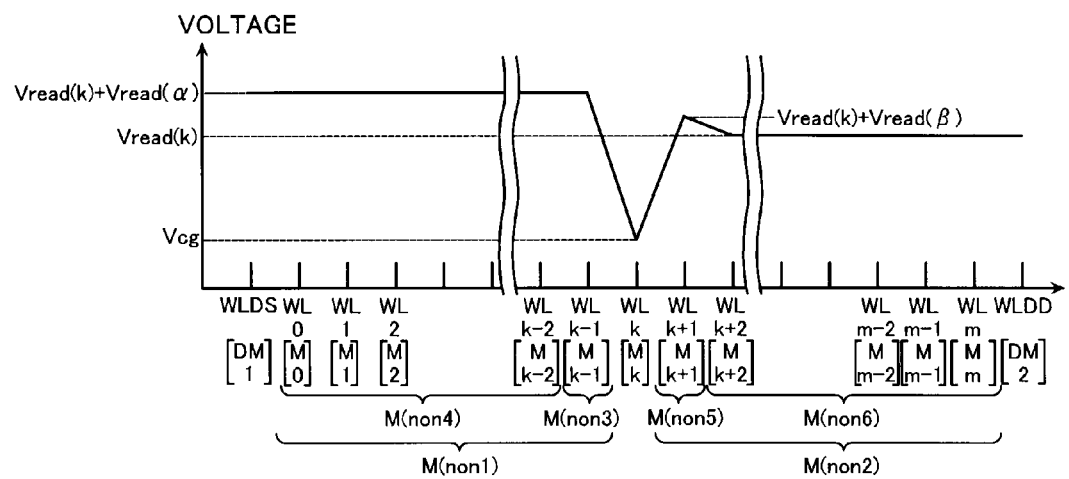
FIG. 22 illustrates voltages applied at the time of a read operation of the non-volatile semiconductor storage device according to a 13th embodiment.

The following description will be made on an operation of the non-volatile semiconductor storage device according to the 13th embodiment. The non-volatile semiconductor storage device according to the 13th embodiment performs a sequential writing in a similar manner to the first embodiment. As indicated by the labels a-d of FIG. 17, the non-volatile semiconductor storage device applies a higher voltage to the gates of the unselected memory cells M at the time of a read operation as the selected memory cell M is closer to the bit line BL. Referring now to FIG. 22, the following description will be made on differences from the above embodiments in a read operation of the non-volatile semiconductor storage device according to the 13th embodiment.

FIG. 22 illustrates a case where the memory cell Mk is selected and read. As illustrated in FIG. 22, the control signal generation circuit 16 applies the same voltages as those described in the sixth embodiment to the word lines WL0 to WLm (the gates of the memory cells M0 to Mm). In addition, the control signal generation circuit 16 applies the voltage Vread(k)+Vread($\alpha$) to the dummy word line WLDS (the gates of the dummy memory cells DM1) as with the word line WL0. Furthermore, the control signal generation circuit 16 applies the voltage Vread(k) to the dummy word line WLDD (the gates of the dummy memory cells DM2) as with the word line WLm.

[Advantages of Non-Volatile Semiconductor Storage Device in 13th Embodiment]

The non-volatile semiconductor storage device according to the 13th embodiment has the same advantages as the sixth and eighth embodiments.

[14th Embodiment]
[Configuration of Non-Volatile Semiconductor Storage Device in 14th Embodiment]

The non-volatile semiconductor storage device according to a 14th embodiment will now be described below. The non-volatile semiconductor storage device according to the 14th embodiment comprises the components similar to those described in the eighth embodiment, and is only different from the eighth embodiment in operation. Note that the components similar to the first to 13th embodiments are denoted with the same reference numerals in the 14th embodiment, and description thereof will be omitted.

[Operation of Non-Volatile Semiconductor Storage Device in 14th Embodiment]

Figure 23:
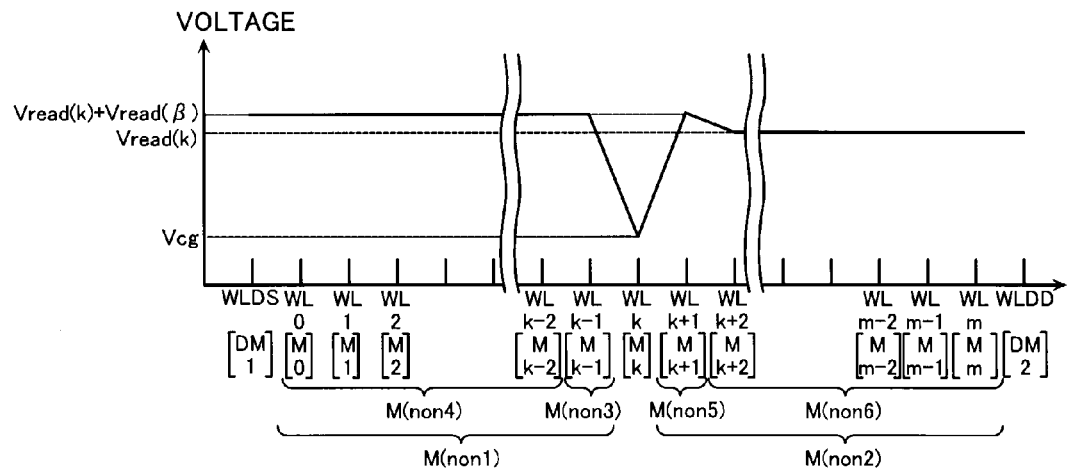
FIG. 23 illustrates voltages applied at the time of a read operation of the non-volatile semiconductor storage device according to a 14th embodiment.

The following description will be made on an operation of the non-volatile semiconductor storage device according to the 14th embodiment. The non-volatile semiconductor storage device according to the 14th embodiment performs a sequential writing in a similar manner to the first embodiment. As indicated by the labels a-d of FIG. 17, the non-volatile semiconductor storage device applies a higher voltage to the gates of the unselected memory cells M at the time of a read operation as the selected memory cell M is closer to the bit line BL. Referring now to FIG. 23, the following description will be made on differences from the above embodiments in a read operation of the non-volatile semiconductor storage device according to the 14th embodiment.

FIG. 23 illustrates a case where the memory cell Mk is selected and read. As illustrated in FIG. 23, the control signal generation circuit 16 applies the same voltages as those described in the seventh embodiment to the word lines WL0 to WLm (the gates of the memory cells M0 to Mm). In addition, the control signal generation circuit 16 applies the voltage Vread(k)+Vread($\beta$) to the dummy word line WLDS (the gates of the dummy memory cells DM1) as with the word line WL0. Furthermore, the control signal generation circuit 16 applies the voltage Vread(k) to the dummy word line WLDD (the gates of the dummy memory cells DM2) as with the word line WLm.

[Advantages of Non-Volatile Semiconductor Storage Device in 14th Embodiment]

The non-volatile semiconductor storage device according to the 14th embodiment has the same advantages as the seventh and eighth embodiments.

[15th Embodiment]
[Configuration of Non-Volatile Semiconductor Storage Device in 15th Embodiment]

The non-volatile semiconductor storage device according to a 15th embodiment will now be described below. The non-volatile semiconductor storage device according to the 15th embodiment comprises the components similar to those described in the eighth embodiment, and is only different from the eighth embodiment in operation. Note that the components similar to the first to 14th embodiments are denoted with the same reference numerals in the 15th embodiment, and description thereof will be omitted.

[Operation of Non-Volatile Semiconductor Storage Device in 15th Embodiment]

Figure 24:
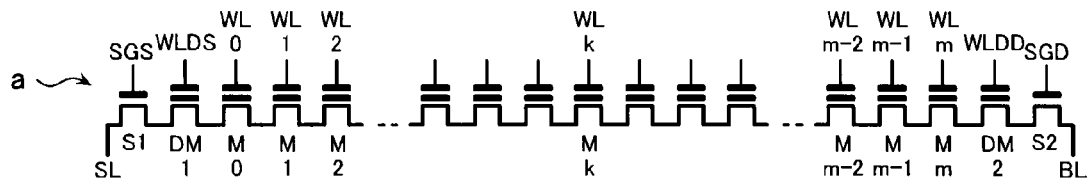
FIG. 24 illustrates voltages applied at the time of a read operation of the non-volatile semiconductor storage device according to a 15th embodiment.
Figure 24:
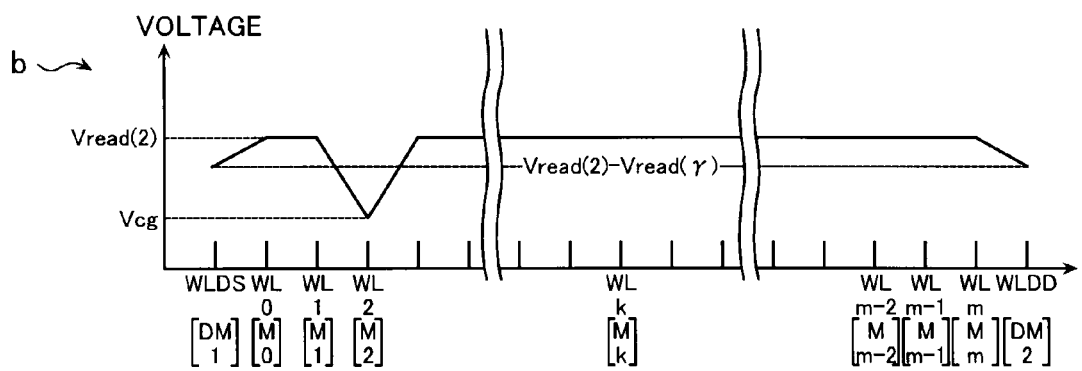
Figure 24:
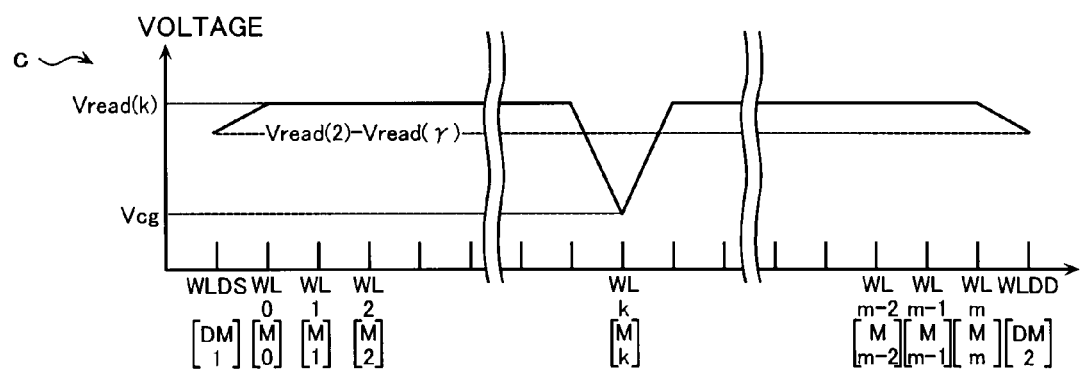
Figure 24:
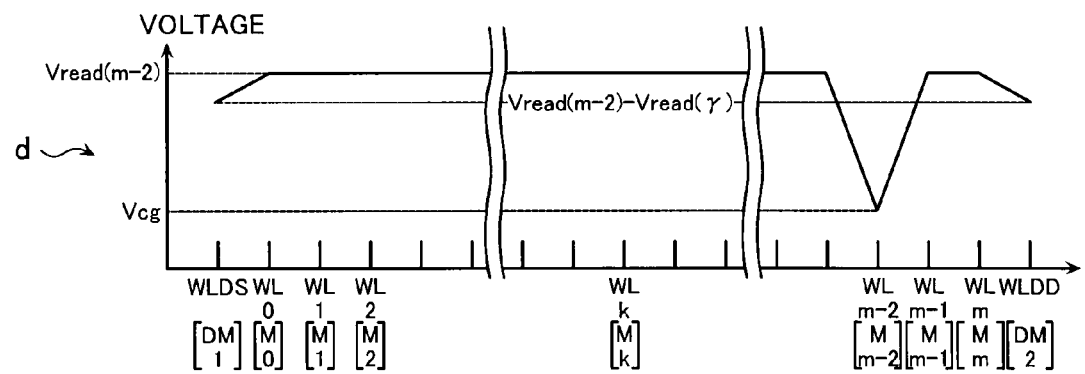

Referring now to FIG. 24, an operation of the non-volatile semiconductor storage device according to the 15th embodiment will be described below. A label "a" of FIG. 24 indicates a relation among the memory cells M0 to Mm, the word lines WL0 to WLm, the dummy memory cells DM1, DM2, and the dummy word lines WLDS, WLDD. A label "b" of FIG. 24 indicates voltages applied to the word lines WL0 to WLm and the dummy word lines WLDS and WLDD when a memory cell M2 close to the source line SL is selected. A label "c" of FIG. 24 indicates voltages applied to the word lines WL0 to WLm and the dummy word lines WLDS and WLDD when a memory cell Mk that is closer to the bit line BL than the memory cell M2 is selected. A label "d" of FIG. 24 indicates voltages applied to the word lines WL0 to WLm and the dummy word lines WLDS and WLDD when a memory cell Mm−2 close to the bit line BL is selected.

The non-volatile semiconductor storage device according to the 15th embodiment performs a sequential writing in a similar manner to the first embodiment. As indicated by the labels a-d of FIG. 24, the non-volatile semiconductor storage device applies a higher voltage to the gates of the unselected memory cells M at the time of a read operation as the selected memory cell M is closer to the bit line BL.

In this case, the dummy memory cells DM1 and DM2 are controlled with the aim of making them always in an erased state. Thus, the threshold voltage of the dummy memory cells DM1 and DM2 will not increase significantly, for example, even when erroneous write is caused by a GIDL current. As such, a voltage applied to the gates of the dummy memory cells DM1 and DM2 may be set lower than that applied to the memory cells M0 and Mm adjacent thereto.

Accordingly, as indicated by the labels a-d of FIG. 24, the non-volatile semiconductor storage device according to the 15th embodiment applies voltages Vread(2)−Vread($\gamma$), Vread(k)−Vread($\gamma$), and Vread(m−2)−Vread($\gamma$) (where Vread($\gamma$)>0) to the dummy word lines WLDS and WLDD (the gates of the dummy memory cells DM1 and DM2). The voltages Vread(2)−Vread($\gamma$), Vread(k)−Vread($\gamma$), and Vread (m−2)−Vread($\gamma$) are lower than the voltages Vread(2), Vread (k), and Vread(m−2) to be applied to the unselected memory cells M during read operations, respectively.

[Advantages of Non-Volatile Semiconductor Storage Device in 15th Embodiment]

The non-volatile semiconductor storage device according to the 15th embodiment has the same advantages as the first embodiment. As with the eighth embodiment, the 15th embodiment may mitigate the effects of leakage currents on the memory cells M0 to Mm with the dummy memory cells DM1 and DM2, achieving higher reliability than the first embodiment. Furthermore, the 15th embodiment may realize lower power consumption as compared with the eighth embodiment since a voltage equal to or less than the voltage of the word line WL is applied to the dummy word lines WLDS and WLDD.

[16th Embodiment]

[Configuration of Non-Volatile Semiconductor Storage Device in 16th Embodiment]

Figure 25:
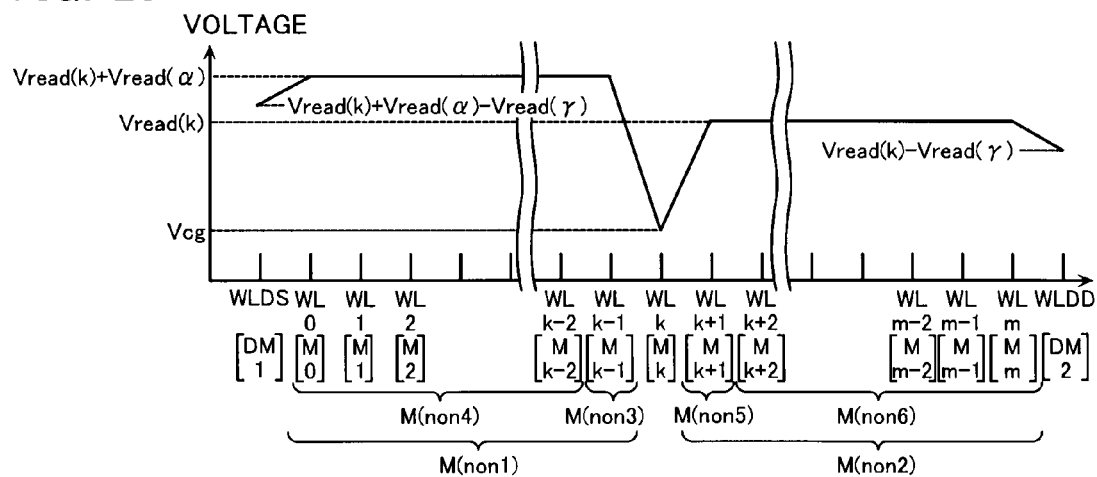
FIG. 25 illustrates voltages applied at the time of a read operation of the non-volatile semiconductor storage device according to a 16th embodiment.

Referring now to FIG. 25, the non-volatile semiconductor storage device according to a 16th embodiment will be described below. The non-volatile semiconductor storage device according to the 16th embodiment comprises the components similar to those described in the eighth embodiment, and is only different from the eighth embodiment in operation. Note that the components similar to the first to 15th embodiments are denoted with the same reference numerals in the 16th embodiment, and description thereof will be omitted.

[Operation of Non-Volatile Semiconductor Storage Device in 16th Embodiment]

The following description will be made on an operation of the non-volatile semiconductor storage device according to the 16th embodiment. The non-volatile semiconductor storage device according to the 16th embodiment performs a sequential writing in a similar manner to the first embodiment. As indicated by the labels a-d of FIG. 24, the non-volatile semiconductor storage device applies a higher voltage to the gates of the unselected memory cells M at the time of a read operation as the selected memory cell M is closer to the bit line BL. Referring now to FIG. 25, the following description will be made on differences from the above embodiments in a read operation of the non-volatile semiconductor storage device according to the 16th embodiment.

FIG. 25 illustrates a case where the memory cell Mk is selected and read. As illustrated in FIG. 25, the control signal generation circuit 16 applies the same voltages as those described in the second embodiment to the word lines WL0 to WLm (the gates of the memory cells M0 to Mm). In addition, the control signal generation circuit 16 applies a voltage Vread(k)+Vread($\alpha$)−Vread($\gamma$) which is lower than that of the word line WL0 to the dummy word line WLDS (the gates of the dummy memory cells DM1). Furthermore, the control signal generation circuit 16 applies a voltage Vread(k)−Vread ($\gamma$) which is lower than that of the word line WLm to the dummy word line WLDD (the gates of the dummy memory cells DM2).

[Advantages of Non-Volatile Semiconductor Storage Device in 16th Embodiment]

The non-volatile semiconductor storage device according to the 16th embodiment has the same advantages as the second and 15th embodiments.

[17th Embodiment]

[Configuration of Non-Volatile Semiconductor Storage Device in 17th Embodiment]

The non-volatile semiconductor storage device according to a 17th embodiment will now be described below. The non-volatile semiconductor storage device according to the 17th embodiment comprises the components similar to those described in the eighth embodiment, and is only different from the eighth embodiment in operation. Note that the components similar to the first to 16th embodiments are denoted with the same reference numerals in the 17th embodiment, and description thereof will be omitted.

[Operation of Non-Volatile Semiconductor Storage Device in 17th Embodiment]

Figure 26:
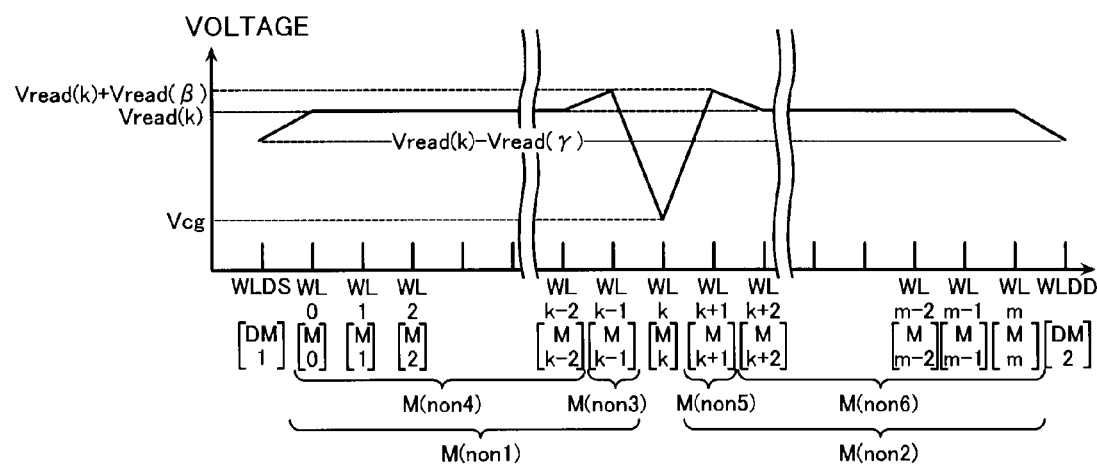
FIG. 26 illustrates voltages applied at the time of a read operation of the non-volatile semiconductor storage device according to a 17th embodiment.

The following description will be made on an operation of the non-volatile semiconductor storage device according to the 17th embodiment. The non-volatile semiconductor storage device according to the 17th embodiment performs a sequential writing in a similar manner to the first embodiment. As indicated by the labels a-d of FIG. 24, the non-volatile semiconductor storage device applies a higher voltage to the gates of the unselected memory cells M at the time of a read operation as the selected memory cell M is closer to the bit line BL. Referring now to FIG. 26, the following description will be made on differences from the above embodiments in a read operation of the non-volatile semiconductor storage device according to the 17th embodiment.

FIG. 26 illustrates a case where the memory cell Mk is selected and read. As illustrated in FIG. 26, the control signal generation circuit 16 applies the same voltages as those described in the third embodiment to the word lines WL0 to WLm (the gates of the memory cells M0 to Mm). In addition, the control signal generation circuit 16 applies a voltage Vread(k)−Vread($\gamma$) which is lower than that of the word line WL0 to the dummy word line WLDS (the gates of the dummy memory cells DM1). Furthermore, the control signal generation circuit 16 applies a voltage Vread(k)−Vread($\gamma$) which is lower than that of the word line WLm to the dummy word line WLDD (the gates of the dummy memory cells DM2).

[Advantages of Non-Volatile Semiconductor Storage Device in 17th Embodiment]

The non-volatile semiconductor storage device according to the 17th embodiment has the same advantages as the third and 15th embodiments.

[18th Embodiment]
[Configuration of Non-Volatile Semiconductor Storage Device in 18th Embodiment]

The non-volatile semiconductor storage device according to an 18th embodiment will now be described below. The non-volatile semiconductor storage device according to the 18th embodiment comprises the components similar to those described in the eighth embodiment, and is only different from the eighth embodiment in operation. Note that the components similar to the first to 17th embodiments are denoted with the same reference numerals in the 18th embodiment, and description thereof will be omitted.

[Operation of Non-Volatile Semiconductor Storage Device in 18th Embodiment]

Figure 27:
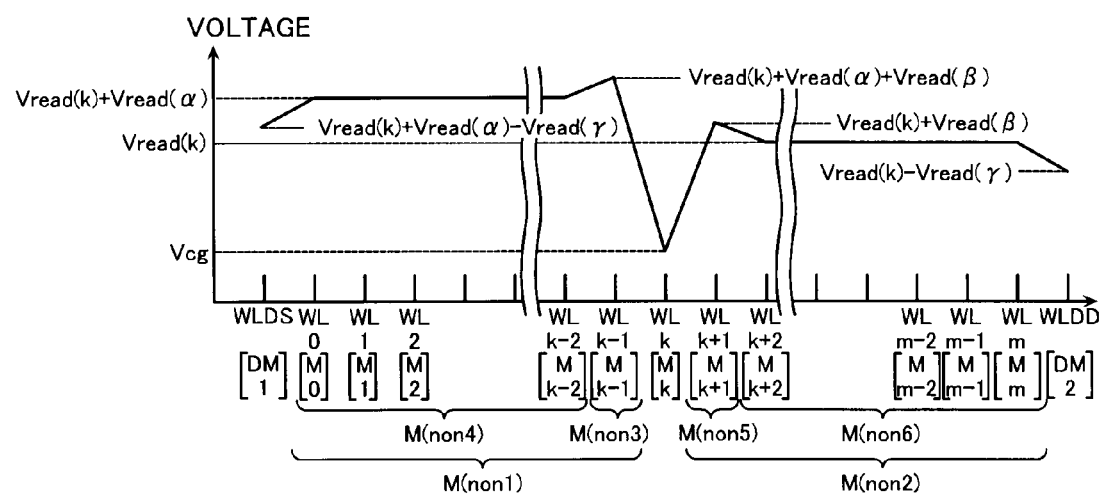
FIG. 27 illustrates voltages applied at the time of a read operation of the non-volatile semiconductor storage device according to an 18th embodiment.

The following description will be made on an operation of the non-volatile semiconductor storage device according to the 18th embodiment. The non-volatile semiconductor storage device according to the 18th embodiment performs a sequential writing in a similar manner to the first embodiment. As indicated by the labels a-d of FIG. 24, the non-volatile semiconductor storage device applies a higher voltage to the gates of the unselected memory cells M at the time of a read operation as the selected memory cell M is closer to the bit line BL. Referring now to FIG. 27, the following description will be made on differences from the above embodiments in a read operation of the non-volatile semiconductor storage device according to the 18th embodiment.

FIG. 27 illustrates a case where the memory cell Mk is selected and read. As illustrated in FIG. 27, the control signal generation circuit 16 applies the same voltages as those described in the fourth embodiment to the word lines WL0 to WLm (the gates of the memory cells M0 to Mm). In addition, the control signal generation circuit 16 applies a voltage Vread(k)+Vread($\alpha$)–Vread($\gamma$) which is lower than that of the word line WL0 to the dummy word line WLDS (the gates of the dummy memory cells DM1). Furthermore, the control signal generation circuit 16 applies a voltage Vread(k)–Vread($\gamma$) which is lower than that of the word line WLm to the dummy word line WLDD (the gates of the dummy memory cells DM2).

[Advantages of Non-Volatile Semiconductor Storage Device in 18th Embodiment]

The non-volatile semiconductor storage device according to the 18th embodiment has the same advantages as the fourth and 15th embodiments.

[19th Embodiment]
[Configuration of Non-Volatile Semiconductor Storage Device in 19th Embodiment]

The non-volatile semiconductor storage device according to a 19th embodiment will now be described below. The non-volatile semiconductor storage device according to the 19th embodiment comprises the components similar to those described in the eighth embodiment, and is only different from the eighth embodiment in operation. Note that the components similar to the first to 18th embodiments are denoted with the same reference numerals in the 19th embodiment, and description thereof will be omitted.

[Operation of Non-Volatile Semiconductor Storage Device in 19th Embodiment]

Figure 28:
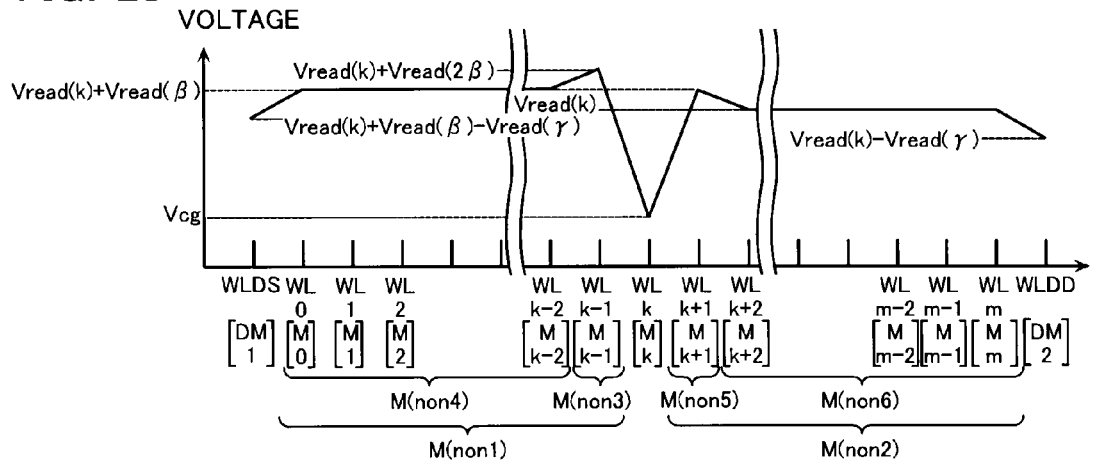
FIG. 28 illustrates voltages applied at the time of a read operation of the non-volatile semiconductor storage device according to a 19th embodiment.

The following description will be made on an operation of the non-volatile semiconductor storage device according to the 19th embodiment. The non-volatile semiconductor storage device according to the 19th embodiment performs a sequential writing in a similar manner to the first embodiment. As indicated by the labels a-d of FIG. 24, the non-volatile semiconductor storage device applies a higher voltage to the gates of the unselected memory cells M at the time of a read operation as the selected memory cell M is closer to the bit line BL. Referring now to FIG. 28, the following description will be made on differences from the above embodiments in a read operation of the non-volatile semiconductor storage device according to the 19th embodiment.

FIG. 28 illustrates a case where the memory cell Mk is selected and read. As illustrated in FIG. 28, the control signal generation circuit 16 applies the same voltages as those described in the fifth embodiment to the word lines WL0 to WLm (the gates of the memory cells M0 to Mm). In addition, the control signal generation circuit 16 applies a voltage Vread(k)+Vread($\beta$)–Vread($\gamma$) which is lower than that of the word line WL0 to the dummy word line WLDS (the gates of the dummy memory cells DM1). Furthermore, the control signal generation circuit 16 applies a voltage Vread(k)–Vread($\gamma$) which is lower than that of the word line WLm to the dummy word line WLDD (the gates of the dummy memory cells DM2).

[Advantages of Non-Volatile Semiconductor Storage Device in 19th Embodiment]

The non-volatile semiconductor storage device according to the 19th embodiment has the same advantages as the fifth and 15th embodiments.

[20th Embodiment]
[Configuration of Non-Volatile Semiconductor Storage Device in 20th Embodiment]

The non-volatile semiconductor storage device according to a 20th embodiment will now be described below. The non-volatile semiconductor storage device according to the 20th embodiment comprises the components similar to those described in the eighth embodiment, and is only different from the eighth embodiment in operation. Note that the components similar to the first to 19th embodiments are denoted with the same reference numerals in the 20th embodiment, and description thereof will be omitted.

[Operation of Non-Volatile Semiconductor Storage Device in 20th Embodiment]

Figure 29:
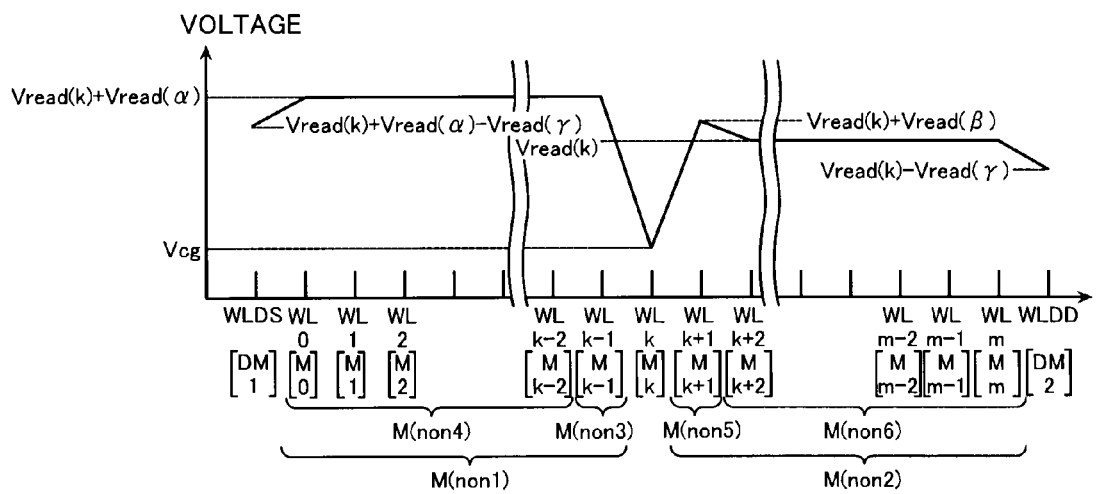
FIG. 29 illustrates voltages applied at the time of a read operation of the non-volatile semiconductor storage device according to a 20th embodiment.

The following description will be made on an operation of the non-volatile semiconductor storage device according to the 20th embodiment. The non-volatile semiconductor storage device according to the 20th embodiment performs a sequential writing in a similar manner to the first embodiment. As indicated by the labels a-d of FIG. 24, the non-volatile semiconductor storage device applies a higher voltage to the gates of the unselected memory cells M at the time of a read operation as the selected memory cell M is closer to the bit line BL. Referring now to FIG. 29, the following description will be made on differences from the above embodiments in a read operation of the non-volatile semiconductor storage device according to the 20th embodiment.

FIG. 29 illustrates a case where the memory cell Mk is selected and read. As illustrated in FIG. 29, the control signal generation circuit 16 applies the same voltages as those described in the sixth embodiment to the word lines WL0 to WLm (the gates of the memory cells M0 to Mm). In addition, the control signal generation circuit 16 applies a voltage Vread(k)+Vread($\alpha$)–Vread($\gamma$) which is lower than that of the word line WL0 to the dummy word line WLDS (the gates of the dummy memory cells DM1). Furthermore, the control signal generation circuit 16 applies a voltage Vread(k)–Vread (γ) which is lower than that of the word line WLm to the dummy word line WLDD (the gates of the dummy memory cells DM2).

[Advantages of Non-Volatile Semiconductor Storage Device in 20th Embodiment]

The non-volatile semiconductor storage device according to the 20th embodiment has the same advantages as the sixth and 15th embodiment.

[21st Embodiment]

[Configuration of Non-Volatile Semiconductor Storage Device in 21st Embodiment]

The non-volatile semiconductor storage device according to a 21st embodiment will now be described below. The non-volatile semiconductor storage device according to the 21st embodiment comprises the components similar to those described in the eighth embodiment, and is only different from the eighth embodiment in operation. Note that the components similar to the first to 20th embodiments are denoted with the same reference numerals in the 21st embodiment, and description thereof will be omitted.

[Operation of Non-Volatile Semiconductor Storage Device in 21st Embodiment]

Figure 30:
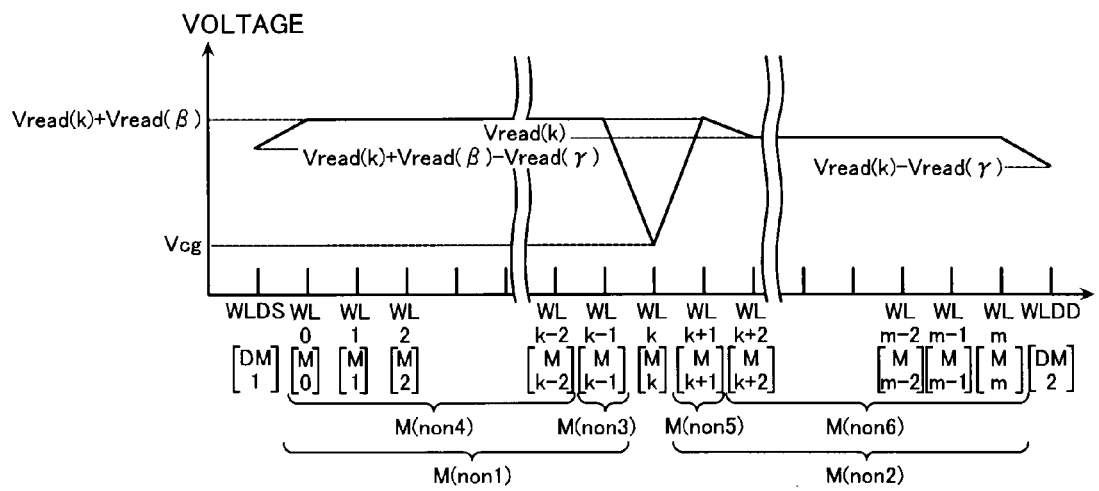
FIG. 30 illustrates voltages applied at the time of a read operation of the non-volatile semiconductor storage device according to a 21st embodiment.

The following description will be made on an operation of the non-volatile semiconductor storage device according to the 21st embodiment. The non-volatile semiconductor storage device according to the 21st embodiment performs a sequential writing in a similar manner to the first embodiment. As indicated by the labels a-d of FIG. 24, the non-volatile semiconductor storage device applies a higher voltage to the gates of the unselected memory cells M at the time of a read operation as the selected memory cell M is closer to the bit line BL. Referring now to FIG. 30, the following description will be made on differences from the above embodiments in a read operation of the non-volatile semiconductor storage device according to the 21st embodiment.

FIG. 30 illustrates a case where the memory cell Mk is selected and read. As illustrated in FIG. 30, the control signal generation circuit 16 applies the same voltages as those described in the seventh embodiment to the word lines WL0 to WLm (the gates of the memory cells M0 to Mm). In addition, the control signal generation circuit 16 applies a voltage Vread(k)+Vread(β)−Vread(γ) which is lower than that of the word line WL0 to the dummy word line WLDS (the gates of the dummy memory cells DM1). Furthermore, the control signal generation circuit 16 applies a voltage Vread (k)−Vread(γ) which is lower than that of the word line WLm to the dummy word line WLDD (the gates of the dummy memory cells DM2).

[Advantages of Non-Volatile Semiconductor Storage Device in 21st Embodiment]

The non-volatile semiconductor storage device according to the 21st embodiment has the same advantages as the seventh and 15th embodiment.

[22nd Embodiment]

[Configuration of Non-Volatile Semiconductor Storage Device in 22nd Embodiment]

The non-volatile semiconductor storage device according to a 22nd embodiment will now be described below. The non-volatile semiconductor storage device according to the 22nd embodiment comprises the components similar to those described in the first embodiment, and is only different from the first embodiment in operation. Note that the components similar to the first to 21st embodiments are denoted with the same reference numerals in the 22nd embodiment, and description thereof will be omitted.

[Operation of Non-Volatile Semiconductor Storage Device in 22nd Embodiment]

Figure 31:
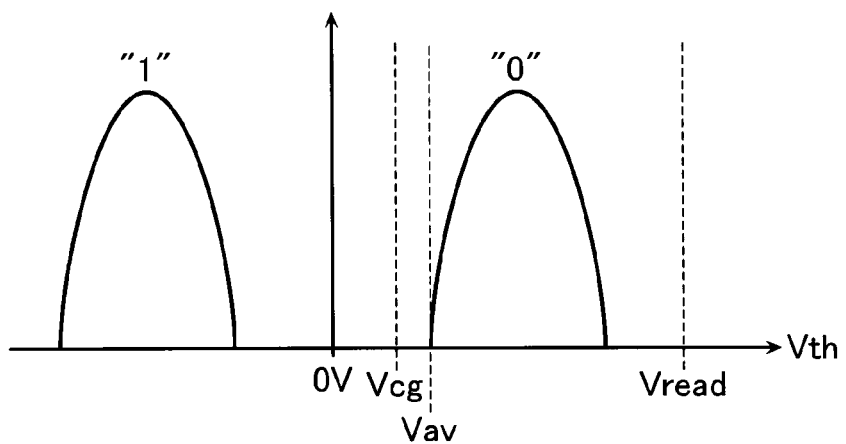
FIG. 31 illustrates a distribution of threshold voltages of a memory cell M for explanation of a verify check according to a 22nd embodiment.
Figure 32:
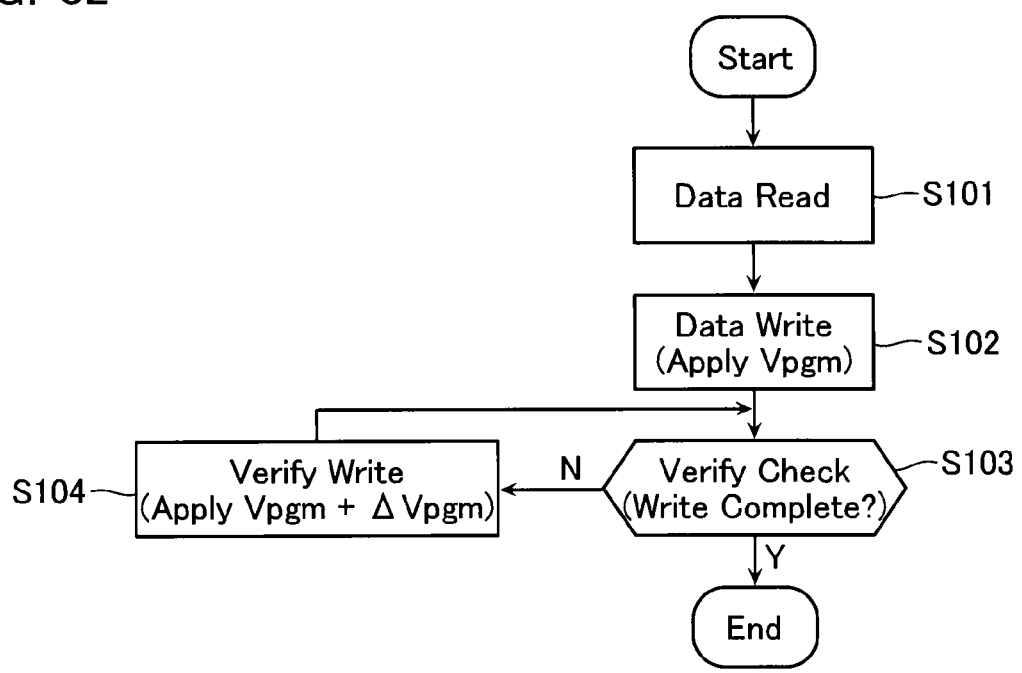
FIG. 32 is a flowchart illustrating an operation of the non-volatile semiconductor storage device according to the 22nd embodiment.
Figure 33:
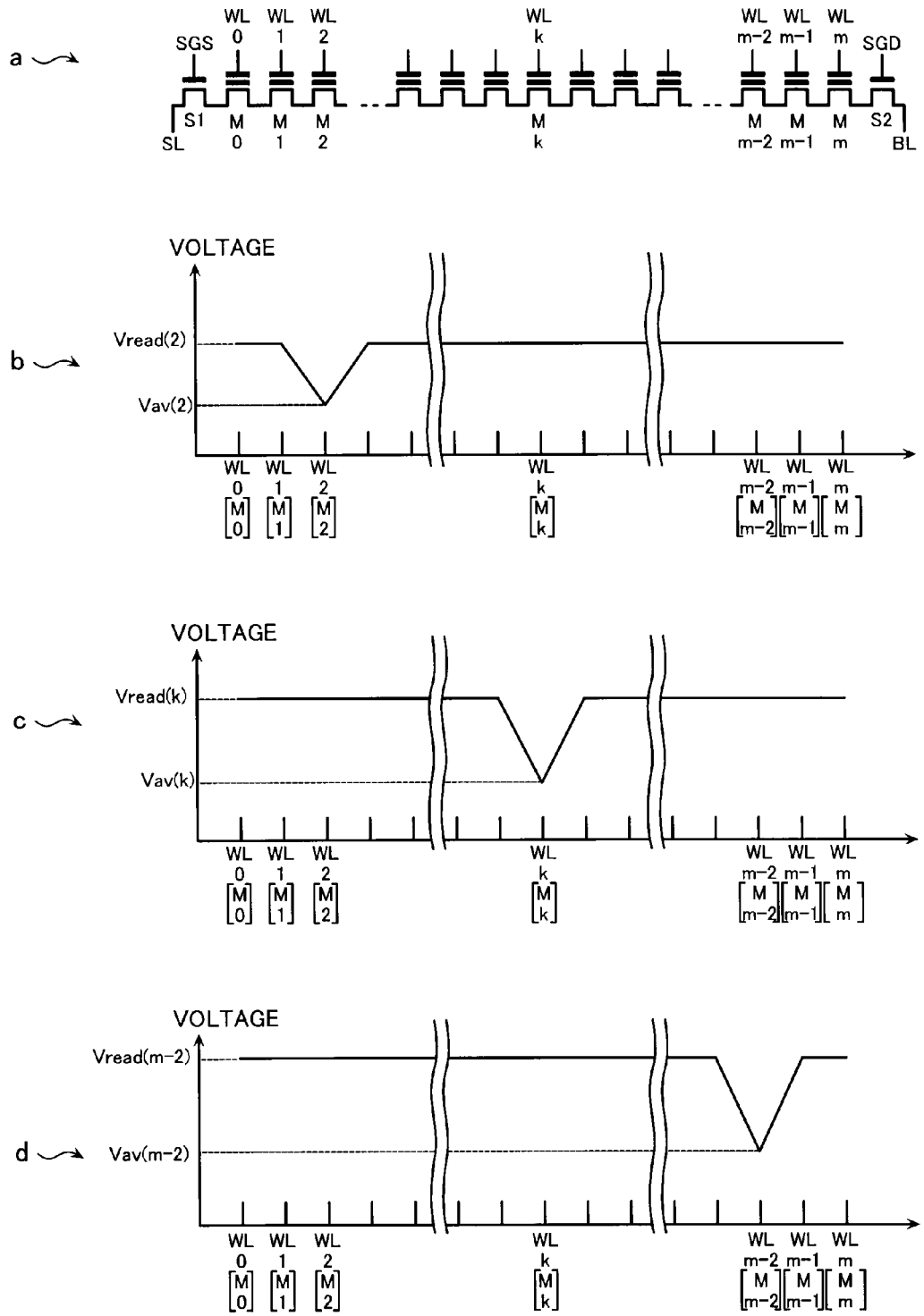
FIG. 33 illustrates voltages applied at the time of a read operation of the non-volatile semiconductor storage device according to the 22nd embodiment.

Referring now to FIGS. 31 to 33, an operation of the non-volatile semiconductor storage device according to the 22nd embodiment will be described below.

The non-volatile semiconductor storage device according to the 22nd embodiment performs a verify check to see whether or not data "0" is written to the selected memory cell Mk. FIG. 31 illustrates a distribution of threshold voltages of a memory cell M for explanation of the verify check. For this verify check, as illustrated in FIG. 31, a verify voltage Vav is set at the side of lower voltage adjacent to the distribution of "0" data. Then, the verify check is carried out based on the conductive state of the selected memory cell M whose gate is applied with the verify voltage Vav.

FIG. 32 is a flowchart illustrating an operation of the non-volatile semiconductor storage device according to the 22nd embodiment. As illustrated in FIG. 32, the control signal generation circuit 16 first performs a data read operation (step S101). Subsequently, the control signal generation circuit 16 applies a voltage Vpgm to the gate of the selected memory cell Mk, and thereby writes data "0" to the selected memory cell Mk (step S102).

Then, the control signal generation circuit 16 performs a verify check based on the verify voltage Vav as illustrated in FIG. 31 (to determine whether or not the write operation is completed) (step S103). If it is determined at step S103 that the write operation is not completed (N out of step S103), then the control signal generation circuit 16 applies a voltage Vpgm+ΔVpgm to the gate of the selected memory cell Mk to perform a verify write operation (step S104). After step S104, the control signal generation circuit 16 performs step S103 again. Alternatively, if it is determined at step S103 that the write operation is completed (Y out of step S103), then the control signal generation circuit 16 terminates the above-mentioned operation.

As described above, recall that the closer a memory cell M is to the source line SL, the more times the voltage Vpass is applied to the memory cell M after the write operation. This results in higher threshold voltages of memory cells M closer to the source line SL.

To get around this problem, according to the 22nd embodiment, the verify check is performed with lower verify voltages Vav(2), Vav(k), and Vav (m−2) as the selected memory cells M2, Mk, and Mm−2 (WL2, WLk, and WLm−2) are closer to the source line SL, as indicated by labels a-d of FIG. 33. Note that the non-volatile semiconductor storage device according to the 22nd embodiment performs a sequential writing in a similar manner to the first embodiment. As indicated by the labels a-d of FIG. 33, the non-volatile semiconductor storage device applies a higher voltage to the gates of the unselected memory cells M at the time of a read operation as the selected memory cell M is closer to the bit line BL.

[Advantages of Non-Volatile Semiconductor Storage Device in 22nd Embodiment]

A selected memory cell, which is previously written to a threshold voltage lower than desired through a verify check according to the 22nd embodiment, will be eventually written up to a desired threshold voltage at the end of the write operations on all of the memory cells, by applying the voltage Vpass more than once thereto. Consequently, the non-volatile semiconductor storage device according to the 22nd embodiment may address the problem that memory cells M closer to the source line SL would have higher threshold voltages. Note that the non-volatile semiconductor storage device according to the 22nd embodiment has the same advantages as the first embodiment.

[23rd Embodiment]

[Configuration of Non-Volatile Semiconductor Storage Device in 23rd Embodiment]

The non-volatile semiconductor storage device according to a 23rd embodiment will now be described below. The non-volatile semiconductor storage device according to the 23rd embodiment comprises the components similar to those described in the first embodiment, and is only different from the first embodiment in operation. Note that the components similar to the first to 22nd embodiments are denoted with the same reference numerals in the 23rd embodiment, and description thereof will be omitted.

[Operation of Non-Volatile Semiconductor Storage Device in 23rd Embodiment]

Figure 34:
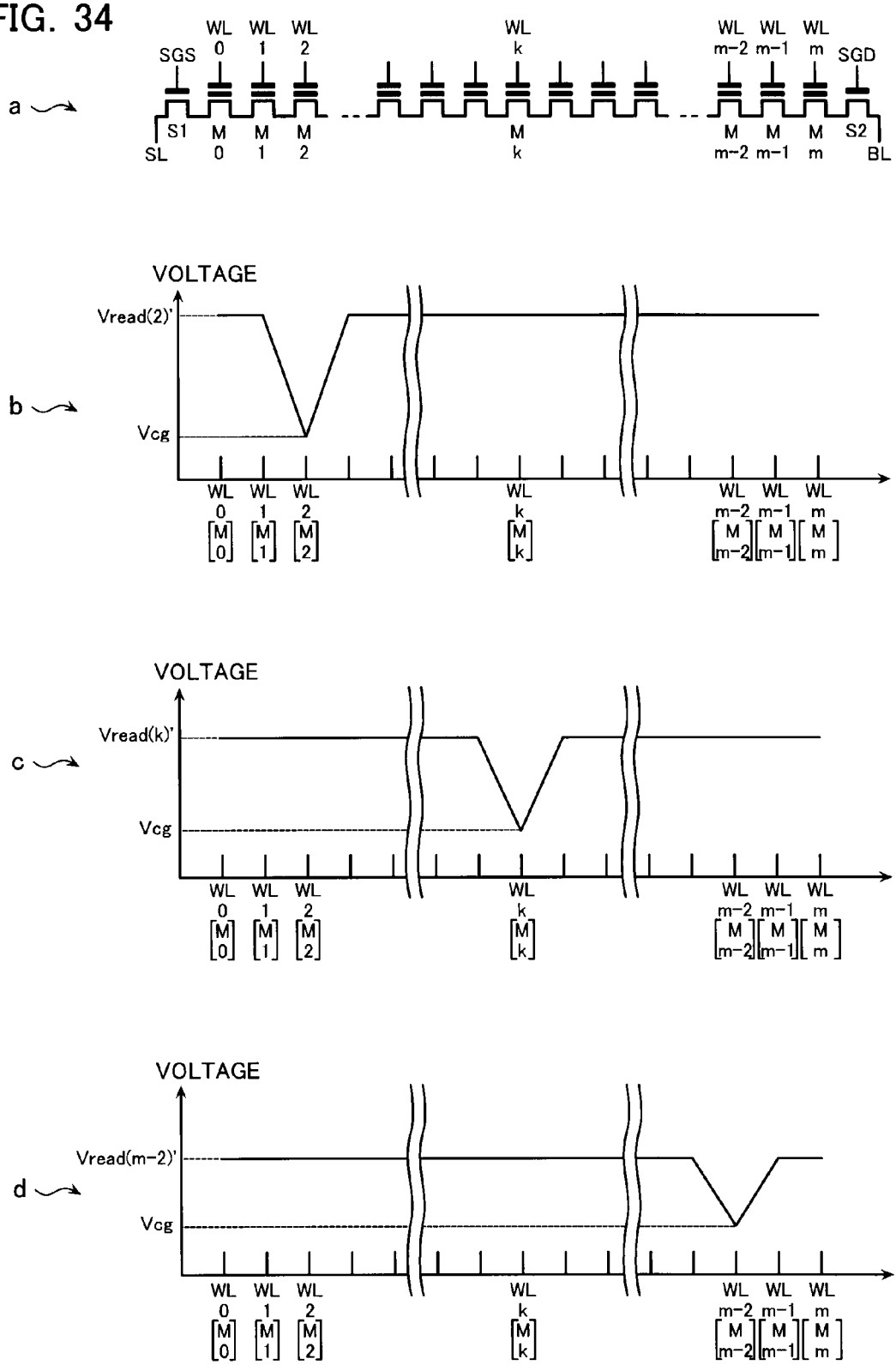
FIG. 34 illustrates voltages applied at the time of a read operation of the non-volatile semiconductor storage device according to a 23rd embodiment.

Referring now to FIG. 34, the following description will be made on voltages applied when reading respective memory cells M0 to Mm in a NAND cell unit NU according to the 23rd embodiment. A label "a" of FIG. 34 indicates a relation among the memory cells M0 to Mm and the word lines WL0 to WLm. A label "b" of FIG. 34 indicates voltages applied to the word lines WL0 to WLm when a memory cell M2 close to the source line SL is selected. A label "c" of FIG. 34 indicates voltages applied to the word lines WL0 to WLm when a memory cell Mk that is closer to the bit line BL than the memory cell M2 is selected (2<k<m−2). A label "d" of FIG. 34 indicates voltages applied to the word lines WL0 to WLm when a memory cell Mm−2 close to the bit line BL is selected.

As indicated by the label "b" of FIG. 34, when the memory cell M2 is selected to read data therefrom, the voltage Vcg is applied to the selected word line WL2 and a voltage Vread(2)' is applied to the unselected word lines WL0, WL1, and WL3 to WLm.

On the other hand, as indicated by the label "c" of FIG. 34, when the memory cell Mk is selected to read data therefrom, the voltage Vcg is applied to the selected word line WLk. This point is similar to that indicated by the label "b" of FIG. 34. However, a voltage Vread(k)' is applied to the unselected word lines WL0 to WLk−1 and WLk+1 to WLm. This voltage Vread(k)' is smaller than the voltage Vread(2)'.

In addition, as indicated by the label "d" of of FIG. 34, when the memory cell Mm−2 is selected to read data therefrom, the voltage Vcg is applied to the selected word line WLm−2. This point is similar to that indicated by the label b of FIG. 34. However, a voltage Vread(m−2)' is applied to the unselected word lines WL0 to WLm−3, WLm−1, and WLm. This voltage Vread(m−2)' is smaller than the voltage Vread(k)'.

That is, the control signal generation circuit 16 applies a higher voltage to the gates of the unselected memory cells M at the time of the read operation as the selected memory cell M is closer to the source line SL. In other words, a read pass voltage applied to the gates of the unselected memory cells M when reading a memory cell Mk as a selected memory cell is higher than that applied to the gates of the unselected memory cells M when reading a memory cell Mk+1 closer to the bit line BL than the memory cell Mk as a selected memory cell.

[Advantages of Non-Volatile Semiconductor Storage Device in 23rd Embodiment]

Figure 35:
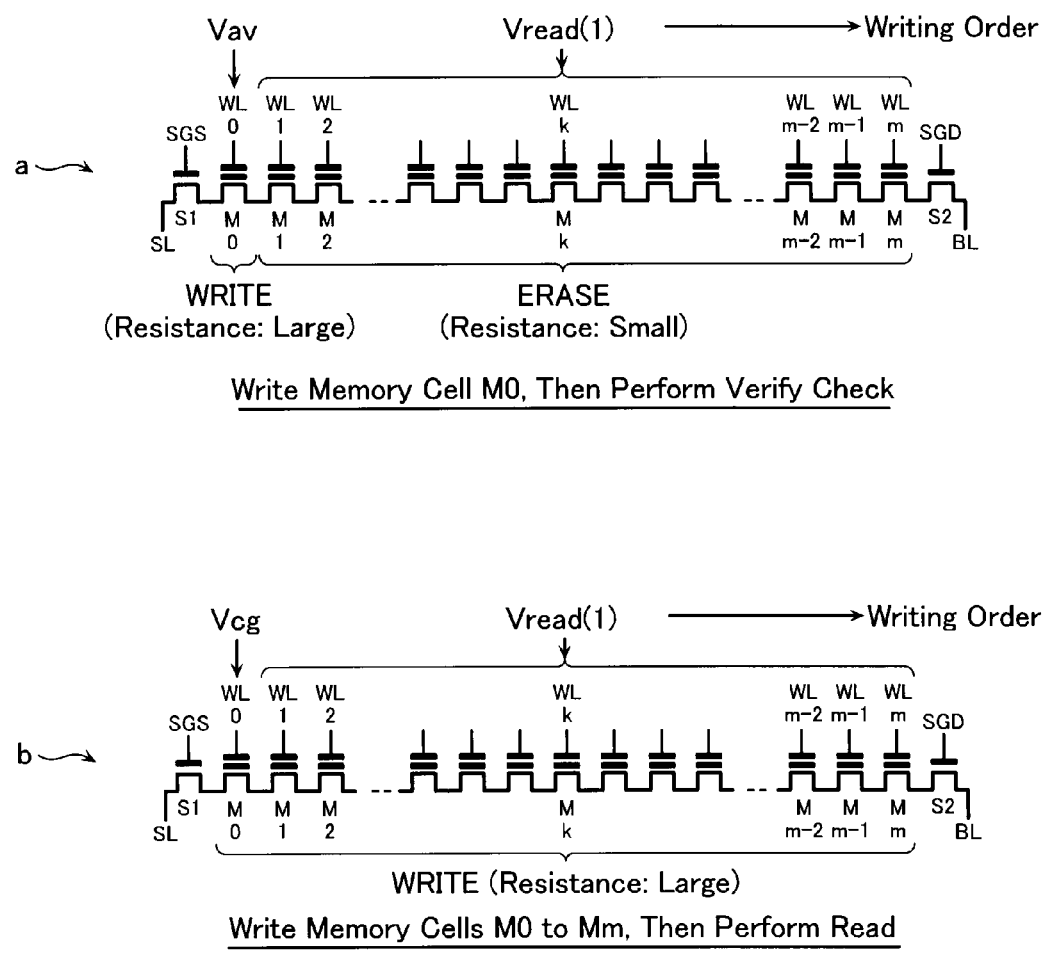
FIG. 35 illustrates examples of voltages applied at the time of a verify check and at the time of a read operation of the non-volatile semiconductor storage device according to the 23rd embodiment.

Referring now to FIG. 35, advantages of the non-volatile semiconductor storage device according to the 23rd embodiment will be described below. FIG. 35 illustrates examples of voltages applied at the time of the verify check and at the time of the read operation. A label "a" of FIG. 35 indicates a case where a write operation is only performed on a selected memory cell M0 according to a sequential writing, and then a verify check is performed on the selected memory cell MO. In this case, a read voltage Vread(1) is applied to the gates of the unselected memory cells M1 to Mm. In addition, a label "b" of FIG. 35 indicates another case where write operations are performed on all of the memory cells M0 to Mm, and then a read operation is performed on the selected memory cell MO. In this case, the read voltage Vread(1) is applied to the gates of the unselected memory cells M1 to Mm.

In the case as indicated by the label "a" of FIG. 35, the unselected memory cells M1 to Mm are each in an unwritten state, i.e., in which state they have low resistance values. In contrast, in the case as indicated by the label "b" of FIG. 35, the unselected memory cells M1 to Mm are each in a written state, i.e., in which state they have higher resistance values than those at the time of the verify check. Accordingly, if the read voltages Vread(1) are equal at the time of the read operation and at the time of the verify check, then data may not sufficiently be read from the selected memory cell M0 at the time of the read operation due to the effects of the already written unselected memory cells MC. This problem will be more pronounced when a memory cell M closer to the source line SL, rather than the bit line BL, is selected according to the sequential writing.

In contrast, the non-volatile semiconductor storage device according to the 23rd embodiment increases the value of the voltage Vread to be applied to the gates of the unselected memory cells M at the time of a read operation as the selected memory cell M is closer to the source line SL. Consequently, the non-volatile semiconductor storage device according to the 23rd embodiment may address the above-mentioned problem and provide accurate sensing of changes in the potential of the bit line BL.

Figure 36:
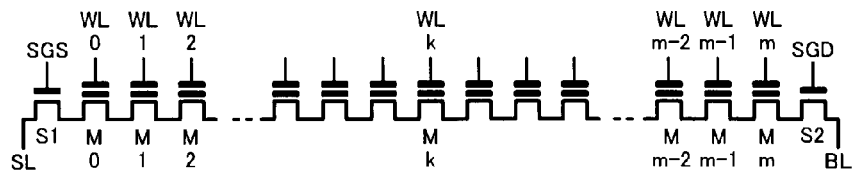
FIG. 36 illustrates voltages applied at the time of a read operation of the non-volatile semiconductor storage device according to a variation of the 23rd embodiment.
Figure 36:
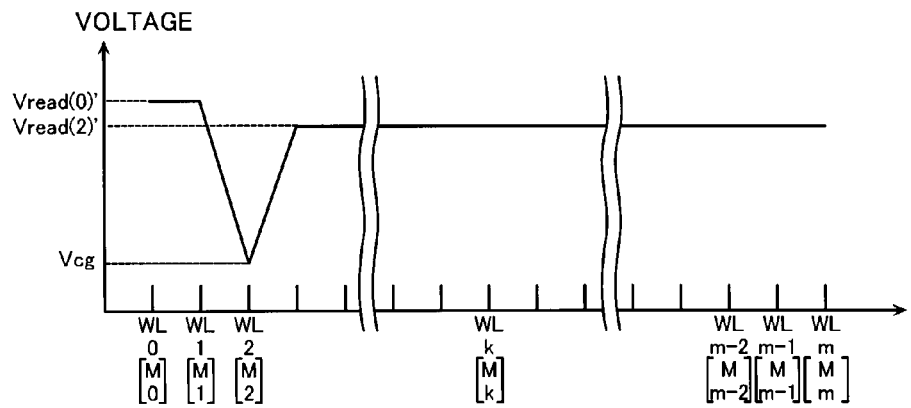
Figure 36:
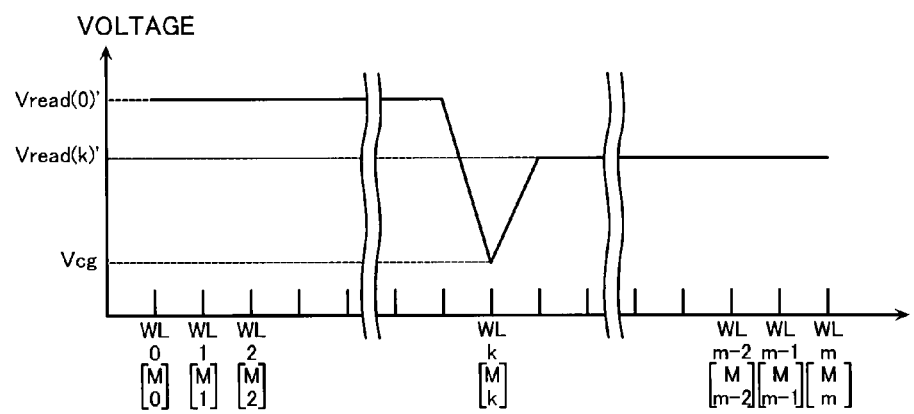
Figure 36:
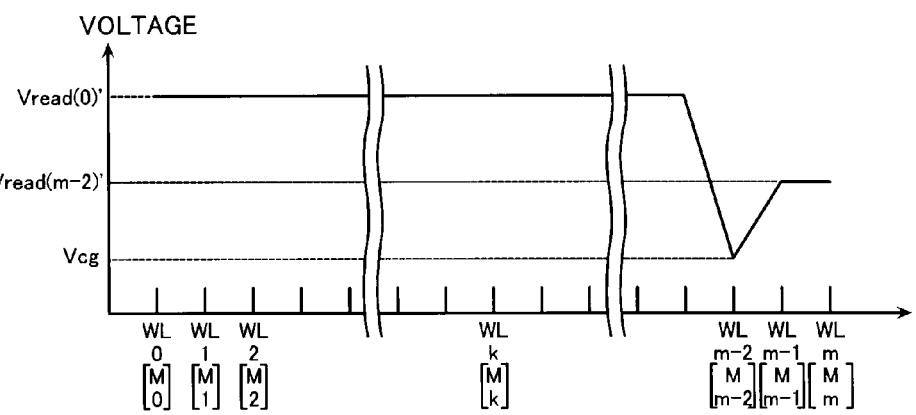

In addition, as illustrated in FIG. 35 in relation to the 23rd embodiment, those unselected memory cells M that are located on the side close to the bit line as viewed from the selected memory cell M are the memory cells that have different resistance values for the verify check and for the read operation. In contrast, the other unselected memory cells M that are located on the side close to the source line SL as viewed from the selected memory cell M do not have different resistance values for the verify check and for the read operation. Therefore, as illustrated in FIG. 36, a higher voltage may be applied to the gates of unselected memory cells M that are located on the side close to the bit line BL as viewed from the selected memory cell M as the selected memory cell M is located at a region closer to the source line SL. On the other hand, the voltage to be applied to the gates of the other unselected memory cells M that are located on the side close to the source line SL as viewed from the selected memory cell M may be fixed to a voltage Vread(0)', irrespective of the position of the selected memory cell M.

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the voltage Vread may be changed for each selected memory cell M or for a plurality of selected memory cells M. That is, in the first embodiment, any control signal generation circuit 16 may be used that applies a higher voltage to the gates of unselected memory cells M as a selected memory cell M is located at a region closer to the bit line BL.

In addition, in the 23rd embodiment, any control signal generation circuit 16 may be used that applies a higher voltage to the gates of unselected memory cells M as a selected memory cell M is located at a region closer to the source line SL. Such a configuration that changes the voltage Vread for a plurality of selected memory cells M may reduce the number of boost circuits required.

The voltage Vav may also be changed for each selected memory cell M or for a plurality of selected memory cells M. That is, the voltage Vav only needs to be set lower as a selected memory cell M is located at a region closer to the source line SL. Such a configuration that changes the voltage Vav for a plurality of selected memory cells M may also reduce the number of boost circuits required.

In addition, in the first embodiment, the voltage Vcg may be set higher as a selected memory cell Mk is closer to the source line SL. Furthermore, in the 23rd embodiment, the voltage Vcg may be set higher as a selected memory cell Mk is closer to the bit line BL. This configuration allows for further control of the threshold voltages of the memory cells M, as with the above-described embodiments.

In addition, the above embodiments have been described in the context of storing binary data. However, the present invention is also applicable to other configurations storing multi-value data.

Figure 37:
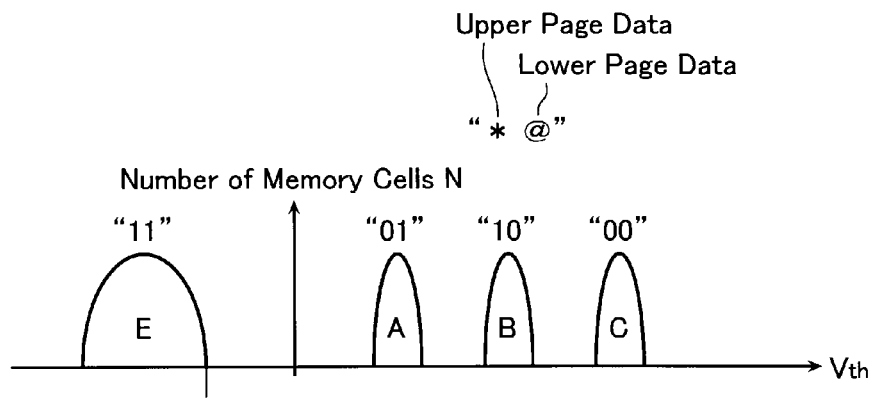
FIG. 37 illustrates examples of data to be written to the flash memory for quaternary value storage.

FIG. 37 illustrates an example of a relation between quaternary data and threshold voltage distributions E, A, B, C when storing 2-bit quaternary data (data "11", "10", "01", "00"), each being stored in a memory cell M as instances of multi-value data.

In the case of FIG. 37, a threshold voltage distribution E of a memory cell M after being erased has an upper limit of a negative value. The threshold voltage distribution E is then assigned with data "11". In addition, memory cells M that represent data "01", "10", and "00" in written states have positive threshold voltage distributions A, B, and C, respectively (lower limits of A, B, and C also have positive values). The threshold voltage distribution A of data "01" has the lowest voltage value, the threshold voltage distribution C of data "00" has the highest voltage value, and the threshold voltage distribution B of data "10" has a voltage value intermediate between data "01" and data "00".

As illustrated in FIG. 37, 2-bit data in one memory cell M includes lower page data and upper page data. The lower page data and the upper page data are written to a memory cell M through separate data write operations, i.e., two different data write operations. In an expression of data "*@", "*" indicates the upper page data and "@" indicates the lower page data.

Figure 38:
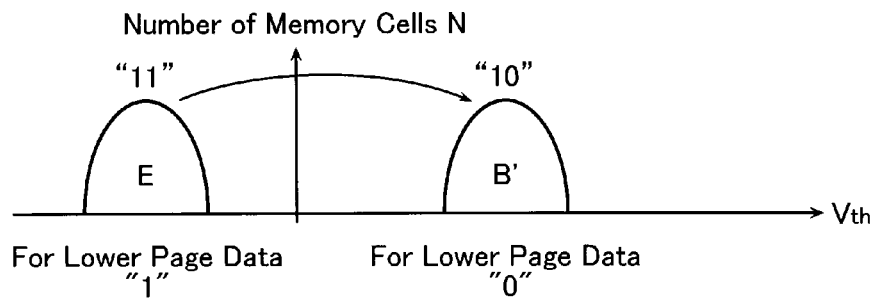
FIG. 38 is a schematic diagram illustrating a data write procedure in the flash memory for quaternary value storage.

Referring now to FIG. 38, a write operation of lower page data will be described below. In FIG. 38, it is assumed that all memory cells M exhibit the threshold voltage distribution E of erased state and store data "11". As illustrated in FIG. 38, when the lower page data is written, the threshold voltage distribution E of the memory cell M is divided into two threshold voltage distributions (E and B') depending on the values of the lower page data ("1" or "0"). That is, when the value of the lower page data is "1", the threshold voltage distribution E of erased state is maintained. Alternatively, when the value of the lower page data is "0", the threshold voltage of the memory cell M is increased by a certain amount. Consequently, the memory cell M changes to the threshold voltage distribution B'.

Figure 39:
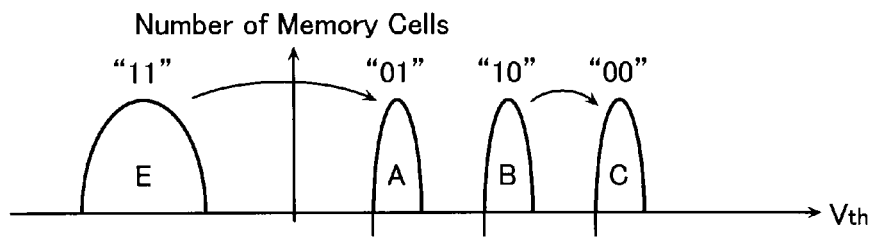
FIG. 39 is a schematic diagram illustrating a data write procedure in the flash memory for quaternary value storage.

Referring now to FIG. 39, a write operation of upper page data will be described below. The upper page data is written based on write data (upper page data) input from outside the chip and lower page data already written to the memory cell M.

That is, as illustrated in FIG. 39, when the value of the upper page data is "1", an increase in the threshold voltage of the memory cell M is prevented. Consequently, the memory cell M of data "11" (the threshold voltage distribution E of erased state) maintains the data "11", and the memory cell M of data "10" (the threshold voltage distribution B') maintains the data "10". However, the lower limit of the threshold voltage distribution B' is adjusted so that the width of the threshold voltage distribution B' is reduced. As a result, the threshold voltage distribution B is formed.

On the other hand, as illustrated in FIG. 39, when the value of the upper page data is "0", the threshold voltage of the memory cell M is increased by a certain amount. Consequently, the memory cell M of data "11" (of the threshold voltage distribution E) changes to data "01" of the threshold voltage distribution A, and the memory cell of data "10" (of the threshold voltage distribution B') changes to data "00" of the threshold voltage distribution C.

Figure 40:
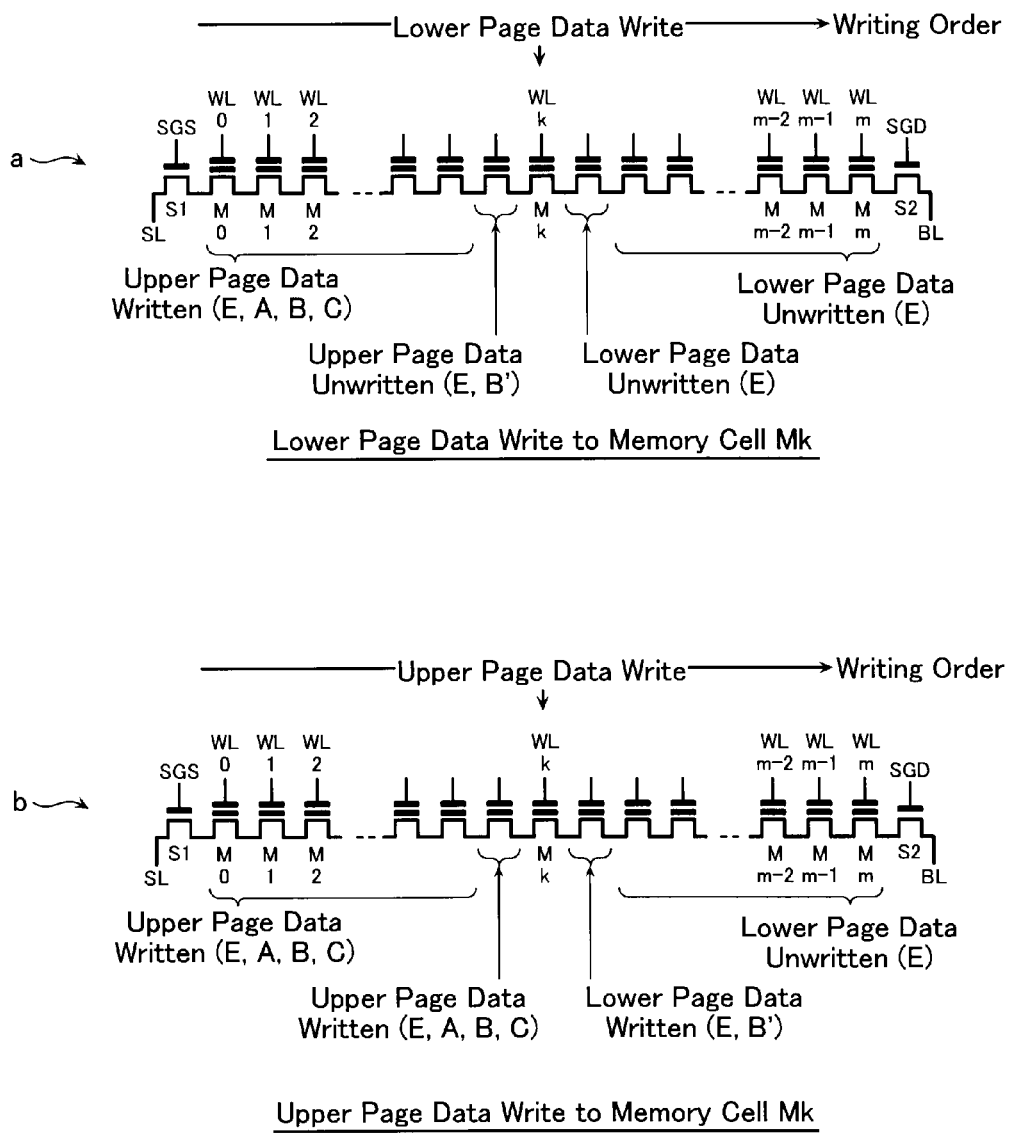
FIG. 40 is a schematic diagram illustrating a data write procedure in the flash memory for quaternary value storage.

Here, as indicated by "a" of FIG. 40, consider a case where the lower page data is written to a selected memory cell Mk by applying the sequential writing for writing quaternary data, as in the above embodiments. In this case, the unselected memory cells M0 to Mk−1 that are located on the side close to the source line SL as viewed from the selected memory cell Mk have already been written with the lower page data, the unselected memory cells M0 to Mk−2 that are located on the side close to the source line SL as viewed from the selected memory cell Mk have already been written with the upper page data. Thus, the threshold voltage distribution of the unselected memory cells M0 to Mk−2 is any of the threshold voltage distributions E, A, B, and C, the threshold voltage distribution of the unselected memory cells Mk−1 is either the threshold voltage distribution E or B'. In addition, the unselected memory cells Mk+1 to Mm that are located on the side close to the bit line BL as viewed from the selected memory cell Mk have not been written with the lower page data. Thus, the threshold voltage distribution of the unselected memory cells Mk+1 to Mm is only the threshold voltage distribution E.

In contrast, as indicated by "b" of FIG. 40, consider a case where the upper page data is written to a selected memory cell Mk by applying a sequential writing for writing quaternary data, as in the above embodiments. In this case, the unselected memory cells M0 to Mk−1 that are located on the side close to the source line as viewed from the selected memory cell Mk have already been written with the upper page data. Thus, the threshold voltage distribution of the unselected memory cells M0 to Mk−1 is any of the threshold voltage distributions E, A, B, and C. In addition, the unselected memory cells Mk+1 that are located on the side close to the bit line BL as viewed from the selected memory cell Mk have already been written with the lower page data, but have not been written with the upper page data. The unselected memory cells Mk+2 to Mm that are located on the side close to the bit line BL as viewed from the selected memory cell Mk have not been written with the lower page data. Thus, the threshold voltage distribution of the unselected memory cells Mk+1 is the threshold voltage distribution E or B'. The threshold voltage distribution of the unselected memory cells Mk+2 to Mm is only the threshold voltage distribution E.

That is, as indicated by "a" and "b" of FIG. 40, the threshold voltage distributions of the unselected memory cells Mk−1 and Mk+1 at the time of writing the upper page data to the selected memory cell Mk are larger than those at the time of writing the lower page data to the selected memory cell Mk. As a result, it can be difficult to read data at the time of a verify check while the upper page data is being written.

Figure 41:
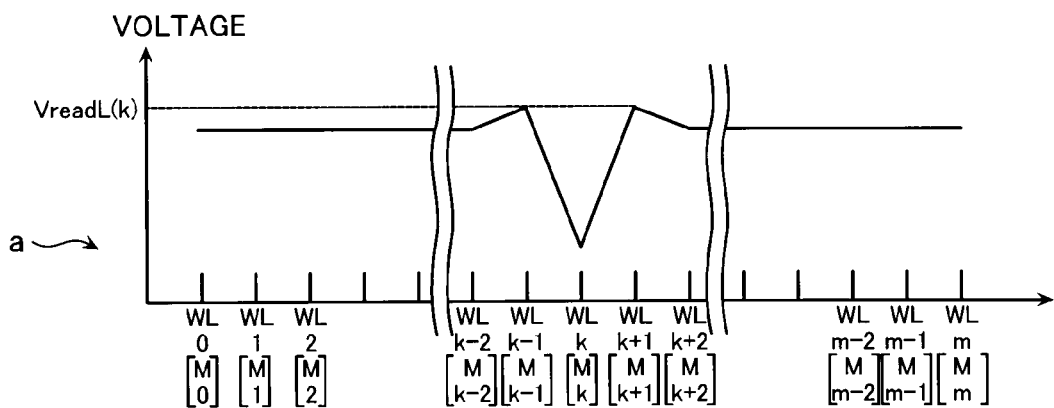
FIG. 41 illustrates voltages applied at the time of a read operation of the non-volatile semiconductor storage device according to a variation of the embodiments.
Figure 41:
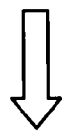
Figure 41:
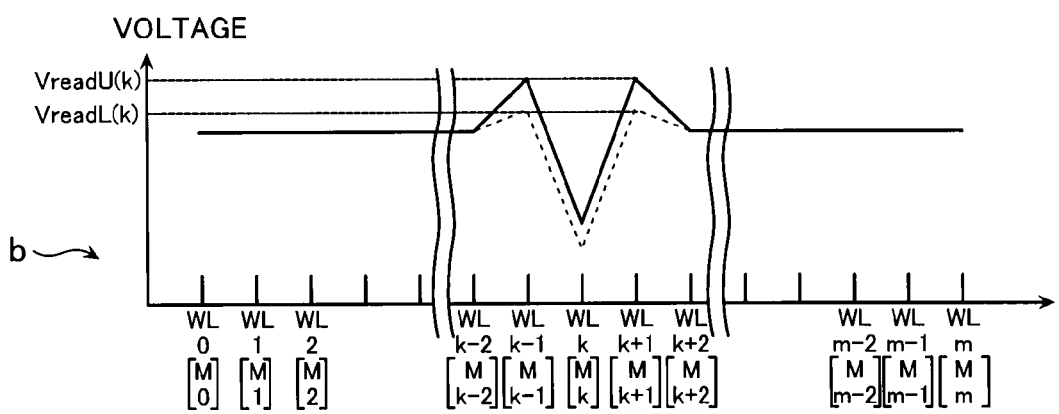

Therefore, a variation of this embodiment applying a write operation of quaternary data may perform an operation as illustrated in FIG. 41. That is, as indicated by "a" of FIG. 41, when a verify check is performed at the time of writing the lower page data to a selected memory cell Mk, this variation applies a voltage VreadL(k) to the gates of the unselected memory cells Mk−1 and Mk+1. Then, as indicated by "b" of FIG. 41, when a verify check is performed at the time of writing the upper page data to the selected memory cell Mk, the variation applies a voltage VreadU(k) (>voltage VreadL (k)) to the gates of the unselected memory cells Mk−1 and Mk+1. Then, the variation of the embodiment may reduce the resistance values of the unselected memory cells Mk−1 and Mk+1 whose threshold voltage distributions are increased due to the write operations of lower and upper page data. This may facilitate a data read operation of this variation when a verify check is performed at the time of writing upper page data.

Figure 42:
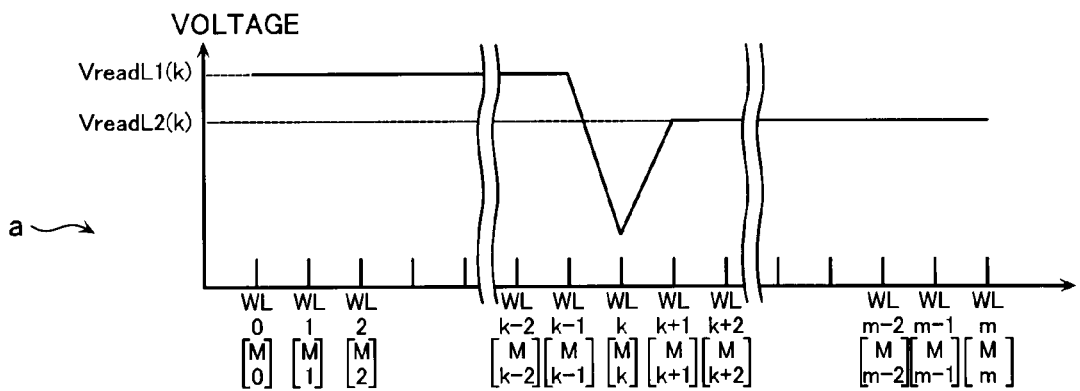
FIG. 42 illustrates voltages applied at the time of a read operation of the non-volatile semiconductor storage device according to a variation of the embodiments.
Figure 42:
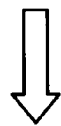
Figure 42:
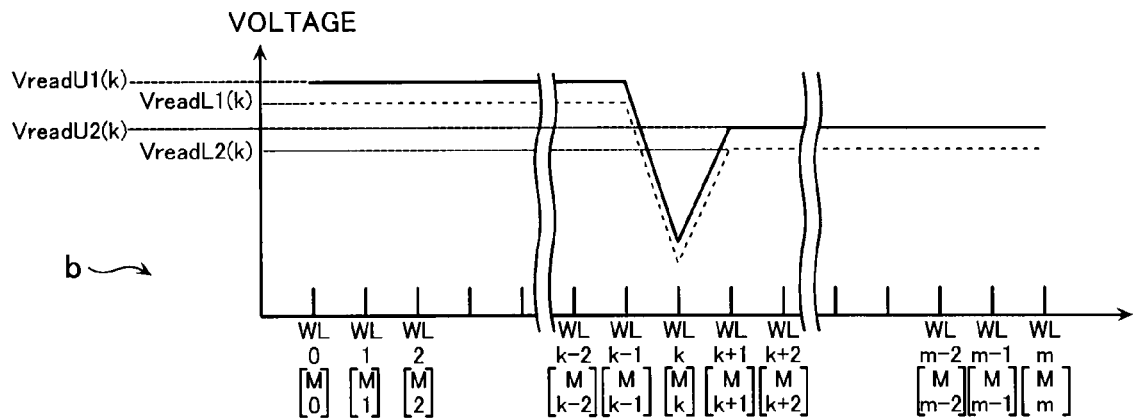

The variation may also perform an operation as illustrated in FIG. 42. That is, as indicated by "a" of FIG. 42, when a verify check is performed at the time of writing the lower page data to a selected memory cell Mk, the variation applies a voltage VreadL1(k) to the gates of the unselected memory cells Mk0 to Mk−1, and a voltage Vread2(k) (<VreadL1(k)) to the gates of the unselected memory cells Mk+1 to Mm. Then, as indicated by "b" of FIG. 42, when a verify check is performed at the time of writing the upper page data to the selected memory cell Mk, the variation applies a voltage VreadU1(k)(>voltage VreadL1(k)) to the gates of the unselected memory cells M0 to Mk−1, and a voltage VreadU2(k) (>VreadL2(k)) to the gates of the unselected memory cells Mk+1 to Mm.

In addition, the 23rd embodiment may have a similar configuration and be configured to be able to perform similar operations to those described in the second to 22nd embodiments.

What is claimed is:

1. A non-volatile semiconductor storage device comprising:
   a memory cell array including an array of memory strings, each of the memory strings including a plurality of memory cells connected in series;
   a first wiring electrically connected to one end of each of the memory strings and charged to a first voltage at the time of a read operation;
   a second wiring electrically connected to the other end of each of the memory strings and set at a second voltage lower than the first voltage at the time of a read operation; and
   a control circuit configured to control data write and read operations to and from the memory cells,
   the control circuit being configured to, at the time of the write operation, control the write operation in each of the memory strings such that a memory cell positioned closer to the second wiring is subject to the write operation earlier, and the write operation sequentially proceeds to farther memory cells, and, at the time of the read operation, apply a higher voltage to gates of unselected memory cells as a selected memory cell is located at a region closer to the first wiring.

2. The non-volatile semiconductor storage device according to claim 1, wherein
   one or more of the unselected memory cells located on the side close to the first wiring as viewed from the selected memory cell are defined as a first unselected memory cell; and
   one or more of the unselected memory cells located on the side close to the second wiring as viewed from the selected memory cell are defined as a second unselected memory cell, and wherein
   a second voltage to be applied to a gate of the second unselected memory cell is higher than a first voltage to be applied to a gate of the first unselected memory cell.

3. The non-volatile semiconductor storage device according to claim 1, wherein
   one of the unselected memory cells located adjacent to the selected memory cell is defined as a third unselected memory cell; and
   one of the unselected memory cells adjacent to the third unselected memory cell is defined as a fourth unselected memory cell, and wherein
   a third voltage to be applied to a gate of the third unselected memory cell is higher than a fourth voltage to be applied to a gate of the fourth unselected memory cell.

4. The non-volatile semiconductor storage device according to claim 1, wherein
   one of the unselected memory cells located on the side close to the first wiring as viewed from a selected memory cell and adjacent to the selected memory cell is defined as a fifth unselected memory cell;
   one of the unselected memory cells adjacent to the fifth unselected memory cell is defined as a sixth unselected memory cell;
   one of the unselected memory cells that is located on the side close to the second wiring as viewed from the selected memory cell and adjacent to the selected memory cell is defined as a seventh unselected memory cell; and
   one of the unselected memory cells adjacent to the seventh unselected memory cell is defined as an eighth unselected memory cell, and wherein
   a fifth voltage to be applied to a gate of the fifth unselected memory cell is higher than a sixth voltage to be applied to a gate of the sixth unselected memory cell;
   an eighth voltage to be applied to a gate of the eighth unselected memory cell is higher than the fifth voltage; and
   a seventh voltage to be applied to a gate of the seventh unselected memory cell is higher than the eighth voltage.

5. The non-volatile semiconductor storage device according to claim 1, wherein
   one of the unselected memory cells located on the side close to the first wiring as viewed from the selected memory cell and adjacent to the selected memory cell is defined as a fifth unselected memory cell;
   one of the unselected memory cells adjacent to the fifth unselected memory cell is defined as a sixth unselected memory cell;
   one of the unselected memory cells that is located on the side close to the second wiring as viewed from a selected memory cell and adjacent to the selected memory cell is defined as a seventh unselected memory cell; and
   one of the unselected memory cells adjacent to the seventh unselected memory cell is defined as an eighth unselected memory cell, and wherein
   a fifth voltage to be applied to a gate of the fifth unselected memory cell is higher than a sixth voltage to be applied to a gate of the sixth unselected memory cell;
   an eighth voltage to be applied to a gate of the eighth unselected memory cell is the same as the fifth voltage; and a seventh voltage to be applied to a gate of the seventh unselected memory cell is higher than the eighth voltage.

6. The non-volatile semiconductor storage device according to claim 1, wherein
one of the unselected memory cells located on the side close to the first wiring as viewed from the selected memory cell and adjacent to the selected memory cell is defined as a ninth unselected memory cell;
one of the unselected memory cells adjacent to the ninth unselected memory cell is defined as a 10th unselected memory cell; and
one of the unselected memory cells located on the side close to the second wiring as viewed from a selected memory cell is defined as an 11th unselected memory cell, and wherein
a ninth voltage to be applied to a gate of the ninth unselected memory cell is higher than a 10th voltage to be applied to a gate of the 10th unselected memory cell; and
an eleventh voltage to be applied to a gate of the 11th unselected memory cell is higher than the ninth voltage.

7. The non-volatile semiconductor storage device according to claim 1, wherein
one of the unselected memory cells located on the side close to the first wiring as viewed from the selected memory cell and adjacent to the selected memory cell is defined as a ninth unselected memory cell;
one of the unselected memory cells adjacent to the ninth unselected memory cell is defined as a 10th unselected memory cell; and
one of the unselected memory cells located on the side close to the second wiring as viewed from a selected memory cell is defined as an 11th unselected memory cell, and wherein
a ninth voltage to be applied to a gate of the ninth unselected memory cell is higher than a 10th voltage to be applied to a gate of the 10th unselected memory cell; and
an eleventh voltage to be applied to a gate of the 11th unselected memory cell is the same as the ninth voltage.

8. The non-volatile semiconductor storage device according to claim 1, further comprising:
a first dummy memory cell connected to one end of the memory cells connected in series; and
a second dummy memory cell connected to the other end of the memory cells connected in series,
wherein the control circuit is configured to apply a voltage to respective gates of the first dummy memory cell and the second dummy memory cell, the voltage being same as a voltage applied to gates of the unselected memory cells.

9. The non-volatile semiconductor storage device according to claim 1, further comprising:
a first dummy memory cell connected to one end of the memory cells connected in series; and
a second dummy memory cell connected to the other end of the memory cells connected in series,
wherein the control circuit is configured to apply a voltage to respective gates of the first dummy memory cell and the second dummy memory cell, the voltage being lower than a voltage applied to gates of the unselected memory cells.

10. The non-volatile semiconductor storage device according to claim 1, wherein
the control circuit is configured to perform a verify check with a verify voltage to see whether or not a write operation is completed based on a certain threshold voltage, and
the verify voltage is set to be lower for the memory cells being closer to the second wiring.

11. A non-volatile semiconductor storage device comprising:
a memory cell array including an array of memory strings, each of the memory strings including a plurality of memory cells connected in series;
a first wiring electrically connected to one end of each of the memory strings and charged to a first voltage at the time of a read operation;
a second wiring electrically connected to the other end of each of the memory strings and set at a second voltage lower than the first voltage at the time of a read operation; and
a control circuit configured to control data write and read operations to and from the memory cells,
the control circuit being configured to, at the time of the write operation, control the write operation in each of the memory strings such that a memory cell positioned closer to the second wiring is subject to the write operation earlier, and the write operation sequentially proceeds to farther memory cells, and, at the time of the read operation, apply a higher voltage to gates of unselected memory cells as a selected memory cell is located at a region closer to the second wiring.

12. The non-volatile semiconductor storage device according to claim 11, wherein
one or more of the unselected memory cells located on the side close to the first wiring as viewed from the selected memory cell are defined as a first unselected memory cell; and
one or more of the unselected memory cells located on the side close to the second wiring as viewed from the selected memory cell are defined as a second unselected memory cell, and wherein
a second voltage to be applied to a gate of the second unselected memory cell is higher than a first voltage to be applied to a gate of the first unselected memory cell.

13. The non-volatile semiconductor storage device according to claim 11, wherein
one of the unselected memory cells located adjacent to the selected memory cell is defined as a third unselected memory cell; and
one of the unselected memory cells adjacent to the third unselected memory cell is defined as a fourth unselected memory cell, and wherein
a third voltage to be applied to a gate of the third unselected memory cell is higher than a fourth voltage to be applied to a gate of the fourth unselected memory cell.

14. The non-volatile semiconductor storage device according to claim 11, wherein
one of the unselected memory cells located on the side close to the first wiring as viewed from a selected memory cell and adjacent to the selected memory cell is defined as a fifth unselected memory cell;
one of the unselected memory cells adjacent to the fifth unselected memory cell is defined as a sixth unselected memory cell; and
one of the unselected memory cells that is located on the side close to the second wiring as viewed from the selected memory cell and adjacent to the selected memory cell is defined as a seventh unselected memory cell; and
one of the unselected memory cells adjacent to the seventh unselected memory cell is defined as an eighth unselected memory cell, and wherein a fifth voltage to be applied to a gate of the fifth unselected memory cell is higher than a sixth voltage to be applied to a gate of the sixth unselected memory cell;

an eighth voltage to be applied to a gate of the eighth unselected memory cell is higher than the fifth voltage; and a seventh voltage to be applied to a gate of the seventh unselected memory cell is higher than the eighth voltage.

15. The non-volatile semiconductor storage device according to claim 11, wherein one of the unselected memory cells located on the side close to the first wiring as viewed from the selected memory cell and adjacent to the selected memory cell is defined as a fifth unselected memory cell;

one of the unselected memory cells adjacent to the fifth unselected memory cell is defined as a sixth unselected memory cell;

one of the unselected memory cells that is located on the side close to the second wiring as viewed from a selected memory cell and adjacent to the selected memory cell is defined as a seventh unselected memory cell; and one of the unselected memory cells adjacent to the seventh unselected memory cell is defined as an eighth unselected memory cell, and wherein a fifth voltage to be applied to a gate of the fifth unselected memory cell is higher than a sixth voltage to be applied to a gate of the sixth unselected memory cell;

an eighth voltage to be applied to a gate of the eighth unselected memory cell is the same as the fifth voltage; and a seventh voltage to be applied to a gate of the seventh unselected memory cell is higher than the eighth voltage.

16. The non-volatile semiconductor storage device according to claim 11, wherein one of the unselected memory cells located on the side close to the first wiring as viewed from the selected memory cell and adjacent to the selected memory cell is defined as a ninth unselected memory cell;

one of the unselected memory cells adjacent to the ninth unselected memory cell is defined as a 10th unselected memory cell; and one of the unselected memory cells located on the side close to the second wiring as viewed from a selected memory cell is defined as an 11th unselected memory cell, and wherein a ninth voltage to be applied to a gate of the ninth unselected memory cell is higher than a 10th voltage to be applied to a gate of the 10th unselected memory cell, and an eleventh voltage to be applied to a gate of the 11th unselected memory cell is higher than the ninth voltage.

17. The non-volatile semiconductor storage device according to claim 11, wherein one of the unselected memory cells located on the side close to the first wiring as viewed from the selected memory cell and adjacent to the selected memory cell is defined as a ninth unselected memory cell;

one of the unselected memory cells adjacent to the ninth unselected memory cell is defined as a 10th unselected memory cell; and one of the unselected memory cells located on the side close to the second wiring as viewed from a selected memory cell is defined as an 11th unselected memory cell, and wherein a ninth voltage to be applied to a gate of the ninth unselected memory cell is higher than a 10th voltage to be applied to a gate of the 10th unselected memory cell, and an eleventh voltage to be applied to a gate of the 11th unselected memory cell is the same as the ninth voltage.

18. The non-volatile semiconductor storage device according to claim 11, further comprising:

a first dummy memory cell connected to one end of the memory cells connected in series; and a second dummy memory cell connected to the other end of the memory cells connected in series, wherein the control circuit is configured to apply a voltage to respective gates of the first dummy memory cell and the second dummy memory cell, the voltage being same as a voltage as a voltage applied to gates of the unselected memory cells.

19. The non-volatile semiconductor storage device according to claim 11, further comprising:

a first dummy memory cell connected to one end of the memory cells connected in series; and a second dummy memory cell connected to the other end of the memory cells connected in series, wherein the control circuit is configured to apply a voltage to respective gates of the first dummy memory cell and the second dummy memory cell, the voltage being lower than a voltage applied to gates of the unselected memory cells.

20. The non-volatile semiconductor storage device according to claim 11, wherein the control circuit is configured to perform a verify check with a verify voltage to see whether or not a write operation is completed based on a certain threshold voltage, and the verify voltage is set to be lower for the memory cells being closer to the second wiring.

21. The non-volatile semiconductor storage device according to claim 1, wherein the read operation is performed in a verify operation to see whether or not a data is written to the selected memory cell.

22. The non-volatile semiconductor storage device according to claim 11, wherein the read operation is performed in a verify operation to see whether or not a data is written to the selected memory cell.

* * * * *